US007050337B2

(12) United States Patent
Iwase et al.

(10) Patent No.: US 7,050,337 B2
(45) Date of Patent: May 23, 2006

(54) WRITING CONTROL METHOD AND WRITING CONTROL SYSTEM OF SEMICONDUCTOR STORAGE DEVICE, AND PORTABLE ELECTRONIC APPARATUS

(75) Inventors: Yasuaki Iwase, Tenri (JP); Yoshifumi Yaoi, Yamatokoriyama (JP); Hiroshi Iwata, Nara (JP); Akihide Shibata, Nara (JP); Yoshinao Morikawa, Ikoma (JP); Masaru Nawaki, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 20 days.

(21) Appl. No.: 10/848,082

(22) Filed: May 19, 2004

(65) Prior Publication Data
US 2005/0002263 A1    Jan. 6, 2005

(30) Foreign Application Priority Data
May 20, 2003 (JP) ............................... 2003-142754

(51) Int. Cl.
*G11C 7/00* (2006.01)
(52) U.S. Cl. ............................. 365/189.05; 365/189.04
(58) Field of Classification Search ...................... None
See application file for complete search history.

(56) References Cited

U.S. PATENT DOCUMENTS

| 5,424,979 | A |   | 6/1995 | Morii |
| 5,519,847 | A |   | 5/1996 | Fandrich et al. |
| 5,910,918 | A | * | 6/1999 | Hirano ............... 365/189.01 |
| 6,522,581 | B1 | * | 2/2003 | Takata et al. .......... 365/185.05 |
| 6,879,520 | B1 | * | 4/2005 | Hosono et al. ........ 365/185.17 |

FOREIGN PATENT DOCUMENTS

| JP | 5-81072 B2 | 11/1993 |
| JP | 5-304277 A | 11/1993 |
| JP | 9-97849 A | 4/1997 |
| JP | 9-116119 A | 5/1997 |
| JP | 2001-156188 A | 6/2001 |
| JP | 2001-230332 A | 8/2001 |
| WO | WO 99/07000 A2 | 2/1999 |
| WO | WO 01/17030 A1 | 3/2001 |
| WO | WO 03/044868 A1 | 5/2003 |
| WO | WO 03/075358 A1 | 9/2003 |
| WO | WO 03/075359 A1 | 9/2003 |
| WO | WO 03/103058 A1 | 12/2003 |
| WO | WO 2004/034474 A1 | 4/2004 |

* cited by examiner

*Primary Examiner*—Son Mai
(74) *Attorney, Agent, or Firm*—Birch, Stewart, Kolasch & Birch, LLP

(57) ABSTRACT

A writing control system providing high-speed writing to a nonvolatile semiconductor storage device, includes (a) a plurality of memory elements each having: a gate electrode provided on a semiconductor layer with an intervening gate insulating film; a channel region provided beneath the gate electrode; a diffusion region provided on both sides of the channel region, having an opposite polarity to the channel region; and a memory functioning member, provided on both sides of the gate electrode, having a function of holding electric charges, (b) a memory array including a page buffer circuit, and (c) CPU controlling writing to the memory array. The CPU loads a first plane of the page buffer circuit with a first byte of data and writes with the first byte of data stored in the first plane. Further, the CPU writes a second byte of data into the second plane and writes the second byte of data having been stored in the second plane while writing the first byte of data having been stored in the first plane into the memory array.

43 Claims, 23 Drawing Sheets

WRITING CONTROL METHOD AND WRITING CONTROL SYSTEM OF SEMICONDUCTOR STORAGE DEVICE, AND PORTABLE ELECTRONIC APPARATUS

This Nonprovisional application claims priority under 35 U.S.C. § 119(a) on patent application Ser. No. 2003/142754 filed in Japan on May 20, 2003, the entire contents of which are hereby incorporated by reference.

FIELD OF THE INVENTION

The present invention relates to a semiconductor storage device including a plurality of memory elements each having: a gate electrode provided on a semiconductor layer with an intervening gate insulating film; a channel region provided beneath the gate electrode; a diffusion region provided on both sides of the channel region, having an opposite polarity to the channel region; and a memory functioning member, provided on both sides of the gate electrode, having a function of holding electric charges, and particularly relates to speedup of writing operation.

BACKGROUND OF THE INVENTION

Conventionally, a flash memory has been used as a nonvolatile memory.

In this flash memory, as shown in FIG. 31, a memory cell is constituted such that a semiconductor substrate 901 includes thereon, via a gate insulating film, a floating gate 902, an insulating film 907, and a word line (control gate) 903 in this order, and a source line 904 and a bit line 905 are formed on both sides of the floating gate 902. Around the memory cell, an element separation region 906 is formed (for example, Japanese Laid-Open Patent Application No. 304277/1993 (Tokukaihei 5-304277; published on Nov. 16, 1993).

The memory cell holds memory depending upon the amount of charges in the floating gate 902. A memory cell array which is an array of memory cells enables rewriting and read-out operations with respect to intended memory cells by applying a predetermined voltage to particularly selected word lines and bit lines.

Such a flash memory shows drain current (Id) to gate voltage (Vg) characteristics as shown in FIG. 32 with variation in the amount of charges in the floating gate. Increase in the amount of negative charges in the floating gate increases a threshold value, and an Id–Vg curve moves substantially parallel to the direction where Vg increases.

However, such a flash memory has the following problems: it is necessary that the insulating film 907 function to isolate the floating gate 902 from the word line 903; and it is difficult to reduce the thickness of the gate insulating film to prevent leakage of charges from the floating gate 902. Therefore, it is difficult to realize the reduction in thickness of the insulating film 907 and the gate insulating film, constraining the realization of a finer memory cell.

SUMMARY OF THE INVENTION

The present invention provides an easily-realized finer semiconductor storage device and a high-speed writing method which is suitable for that semiconductor storage device.

A writing control method of a semiconductor storage device of the present invention is a writing control method of sequentially writing data into a semiconductor storage device, the semiconductor storage device including a memory system having: (a) a memory array having switching memories, i.e. a plurality of memory elements each having: a gate electrode provided on a semiconductor layer with an intervening gate insulating film; a channel region provided beneath the gate electrode; a diffusion region provided on both sides of the channel region, having an opposite polarity to the channel region; and a memory functioning member, provided on both sides of the gate electrode, having a function of holding electric charges; (b) a page buffer circuit including a first plane and a second plane; and (c) a memory control circuit controlling writing with respect to the memory array and being capable of accessing the page buffer circuit, the writing control method comprising:

a first step of writing first data into the first plane;

a second step of controlling the memory control circuit to write the first data having been written into the first plane into the memory array;

a third step of writing second data into the second plane while the first data having been written into the first plane is written into the memory array; and a fourth step of controlling the memory control circuit to write the second data having been written into the second plane into the memory array.

According to the above method, data throughput is increased by pipelining writing operations such that one plane of the page buffer is used to perform writing to the memory array while the other plane of the page buffer is loaded with data to be used in the second plane by the external user such as CPU. The first data is written into the first plane of the page buffer in the first step, whereby writing operation in the second step is set. The external user commands the memory array to perform writing so as to perform writing to the memory array with the first data, data stored in the first plane, whereby writing operation in the second step begins.

Writing operation in the fourth step is set up immediately following the first command to write by the external user. While the memory array is subjected to writing from the first plane in the third step, the second data is written to the second plane of the page buffer, whereby writing operation in the fourth step is set up. To write the second data, data stored in the second plane, into the memory array, the external user controls the memory control circuit, whereby writing operation in the fourth step begins.

Thus, a speedup of writing is realized by performing one-side interleave operation using two page planes in reading and writing. Further, the memory array performs a high speed operation, further speeding up writing operation. Therefore, data processing of the memory array can be improved by using the page buffer in the memory array.

For a fuller understanding of the nature and advantages of the invention, reference should be made to the ensuing detailed description taken in conjunction with the accompanying drawings.

DESCRIPTION OF THE EMBODIMENTS

Figure 1:
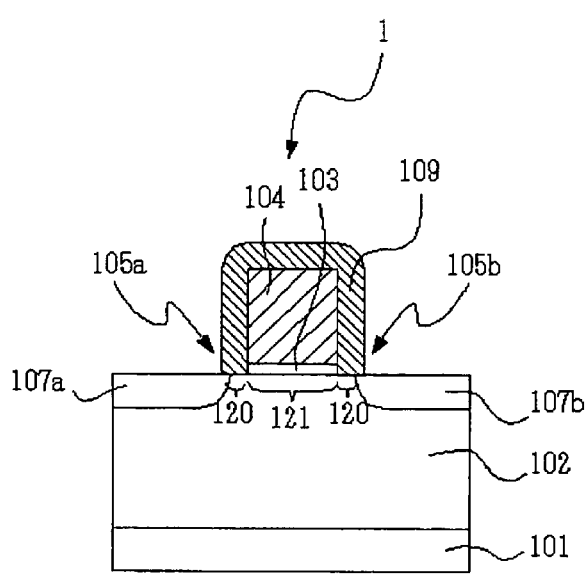
FIG. 1 is a cross-sectional diagram schematically showing a main part of a memory element in a semiconductor storage device of Embodiment 1 of the present invention.
Figure 2:
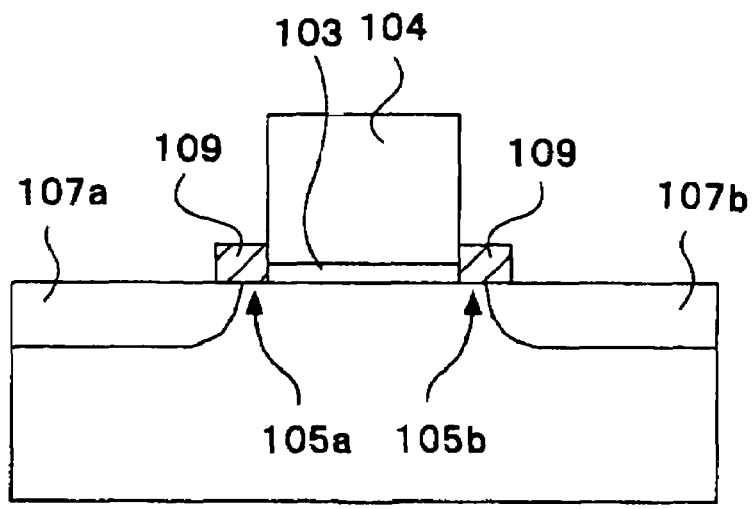
FIGS. 2(a) and 2(b) are cross-sectional diagrams each schematically showing a main part of a modified memory element in the semiconductor storage device of Embodiment 1 of the present invention.
Figure 2:
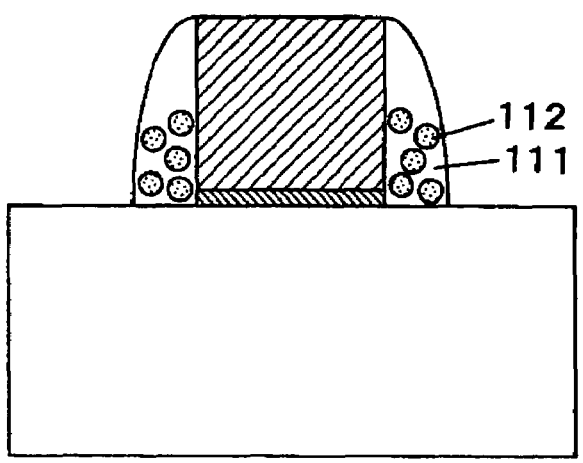

The following will describe embodiments of the present invention with reference to FIG. 1 through FIG. 30.

A semiconductor storage device of the present invention mainly includes a memory element and a control circuit for storing data in the memory element.

The memory element mainly consists of a semiconductor layer, a gate insulating film, a gate electrode, a channel region, a diffusion region, and a memory functioning member. Here, the channel region, which is a conducting region of the same type as the semiconductor layer, means a region beneath the gate electrode. The diffusion region means a conducting region of the other type than the channel region.

Specifically, the memory element (device) of the present invention may be provided with a first conductive region (which acts as a diffusion region), a second conductive region (which acts as a channel region), a memory functioning member, a gate insulating film, and an electrode. The first conductive region is of a first conductivity type (either n- or p-type), and the second conductive region is of a second conductivity type, that is, of the other type (where the first conductive region is n-type, the second conductive region is p-type, and vice versa). The memory functioning member is provided over a boundary between the first and second conductive regions. The gate insulating film is provided between the memory functioning member and the electrode. However, it is appropriate that the memory element is so arranged as to include (i) a gate electrode provided on a gate insulating film, (ii) two memory functioning members provided on both sides of the gate electrode, (iii) and two diffusion regions provided such that the memory functioning members are respectively sandwiched between each diffusion region and the gate electrode, and (iv) a channel region provided under the gate electrode.

A semiconductor device of the present embodiment is preferably arranged such that the device is formed on a well region of the first conductivity type, the well region being formed on a semiconductor substrate or preferably in the semiconductor substrate, and acting as a semiconductor layer. The semiconductor substrate is not particularly limited, provided that the semiconductor substrate is applicable for a semiconductor device. For example, a bulk substrate made from an element semiconductor or a compound semiconductor may be used. Examples of the element semiconductor are silicon, germanium, and the like. Examples of the compound semiconductor are silicon germanium, GaAs, InGaAs, ZnSe, GaN, and the like. Moreover, the semiconductor substrate may be a substrate whose top layer is a semiconductor layer. Examples of this type of the substrate are: various substrates such as SOI (Silicon on Insulator) substrates, SOS substrate, multi-layer SOI substrate; and a substrate having a semiconductor layer on a substrate made of glass or plastic. Of those substrates, the silicon substrate, the SOI substrate (whose top layer is a silicon layer) and the like are preferable. The semiconductor substrate and the semiconductor layer may be monocrystal (for example, produced by epitaxial growth), polycrystal, or amorphous, even though an amount of current flowing therethrough varies depending on whether they are monocrystal, polycrystal, or amorphous.

It is preferable that an element separating region is provided on the semiconductor layer. By further including, in combination, an element (such as a transistor, a capacitor, and/or a resistor), a circuit formed by using the elements, a semiconductor device, and/or an interlayer-insulating film, the semiconductor layer may have a single-layer structure or a multi-layer structure. Note that the element separating region may be formed from an element separating film such as an LOCOS film, a trench oxide film, an SI film, and the like. The semiconductor layer may be either p-type conductive or n-type conductive. It is preferable that the semiconductor layer is provided with at least one well region of the first conductivity type (p-type or n-type). As the semiconductor layer and the well region, it is possible to use a semiconductor layer and the well region whose impurity concentration is within a range generally used in a field in which the semiconductor device is to be used. In case where the SOI substrate is used to provide the semiconductor layer, the semiconductor layer, which is a top layer and may be provided with a well region, may be provided with a body region under a channel region.

The gate insulating film is not particularly limited, provided that the gate insulating film is a gate insulating film generally used in a semiconductor device. For example, the gate insulating film may be an insulating film such as a silicon oxide film, a silicon nitride film, or the like; a single-layered high dielectric film or a laminate film including the high dielectric film (the high dielectric film may be an aluminum oxide film, titanium oxide film, a tantalum oxide film, a hafnium oxide film, or the like). Of those films, the silicon oxide film is preferable. The gate insulating film may have a thickness of, for example, about 1 nm to 20 nm, preferably of 1 nm to 6 nm. The gate insulating film may be provided only right under the gate electrode, or may have a size larger (a width wider) than the gate electrode.

The gate electrode is provided on the gate insulating film, and has a shape that is usually used in a semiconductor device, or a shape having a recess section in its bottom end portion. It is preferable that the gate electrode has an integrated shape without being separated by using a single-layered or a multi-layered conductive film. However, the gate electrode may be so arranged as to have a shape that is separated by using a single-layered or a multi-layered conductive film. Moreover, the gate electrode may be provided with a side-wall insulating film on its side. The gate electrode is not particularly limited, provided that the gate electrode is a gate electrode generally used in a semiconductor device. The gate electrode may be formed from a conductive film, which may be a single-layered or laminate film prepared from: polysilicon; a metal such as copper, aluminum, or the like; a metal having a high melting point, such as tungsten, titan, tantalum or the like; a silicide of the metal having the melting point; or the like. It is appropriate that the gate electrode has a thickness in a range of from 50 nm to 400 nm approximately, for example. Note that the channel region is formed under the gate electrode.

It is preferable that the gate electrode is provided only on a side wall of a memory functioning member later described, or is so provided as not to cover a top part of the memory functioning member. Those arrangements allow contact plug to be provided in a vicinity of the gate electrode. Therefore, this arrangement makes it easier to attain finer memory element. Moreover, the memory element having the simple arrangement as described above can be easily produced, thereby attaining a better yield.

The memory functioning member at least has a function to hold electric charges (hereinafter, this function is referred to as charge-holding function). In other words, the memory functioning member is configured (i) to accumulate and hold electric charges (charges), (ii) to trap electric charges, or (iii) to stay under an electric charge-polarized condition. The charge-holding function is attained in the memory functioning member, by providing the memory functioning member with a film or a region, which has a function to hold electric charges. Examples of materials to give the charge-holding function are: silicon nitride; silicon; silicate glass containing impurity such as phosphorus, boron, and/or the like; silicon carbide; alumina; high dielectric materials such as hafnium oxide, zirconium oxide, tantalum oxide, and the like; zinc oxide; ferroelectric substances; metals; and the like. Therefore, the memory functioning member may have a single-layered or laminated structure formed from, for example, (i) an insulating film including the silicon nitride film, (ii) an insulating film including a conductive layer or a semiconductor layer; an insulating layer including at least one dot made of a conductive material or a semiconductor material; an insulating film including a ferroelectric film in which polarization of electric charge is caused by applying an electric field and then is maintained; and the like film. Of those films, the silicon nitride film is preferable. The reasons why the silicon nitride film is preferable are as follows: a large hysteresis property can be attained because the silicon nitride film has a large number of levels for trapping electric charges; a good holding property can be attained by the silicon nitride film because the silicon nitride film holds the electric charge for a long time thereby preventing leak path, which causes electric charge leakage; and the silicon nitride film is a raw material used as standard in the LSI process.

With the arrangement in which the memory functioning member is provided with the film (such as the silicon nitride film or the like) having the charge-holding function, it is possible to attain more reliable memory holding function. Because the silicon nitride film is an insulator, electric charge leakage in part of the silicon nitride film will not lead to immediate loss of electric charge from the whole silicon nitride film. Moreover, in case where a plurality of memory elements are arrayed, this arrangement prevents erasure of data stored in a memory functioning member that touches an adjacent memory functioning member when the memory elements get closer to each other, in contrary to an arrangement in which the memory functioning members are conductive. Further, this arrangement allows to provide the contact plug in a greater vicinity of the memory functioning member. In some cases, this arrangement allows the contract plug to be so provided as to overlap the memory functioning member. Thus, this arrangement makes it easier to attain a finer memory element.

Note that the film having the charge-holding function is not necessarily in a film-like shape. Even if the film having the charge-holding function is not in the film-like shape, the more reliable memory holding can be attained. It is preferable that pieces of the film having the charge-holding function are dispersed (scattered) inside the insulating film. Specifically, it is preferable that the pieces of the film having the charge-holding function are scattered in a material in which electric charges are hardly held, for example, in silicon oxide, in such a manner that the pieces are scattered in the material as if dots scattered in the material.

In the case where a conductive film or a semiconductor layer is used as the film having the charge-holding function (charge holding film), it is preferable that the charge holding film is so provided that (i) the charge holding film and (ii) the semiconductor layer (semiconductor substrate, well region, body region, source region, drain region, or diffusion region) or the gate electrode are separated by the insulating film provided therebetween, so that the charge holding film will not directly touch the semiconductor layer or the gate electrode. For example, this arrangement can be attained by (i) a laminate structure in which the conductive film is provided on the insulating film, (ii) a structure in which pieces of the conductive film are scattered, as if dots are scattered therein, in the insulating film, (iii) a structure in which a conductive film is provided in part of side-wall insulating film formed on a side wall of a gate, or (iv) the like structure.

The arrangement is preferable in which the insulating film including the conductive film or the semiconductor film is used as the memory functioning member, because this arrangement makes it possible to freely control an amount of electric charges entering a conductor or a semiconductor in the memory functioning member, thereby making it easier to attain a multi-valued property. Furthermore, the arrangement is preferable in which the insulating film including at least one dot made of a conductive material or a semiconductor material is used as the memory functioning member, because this arrangement makes it easier to write and erase by direct tunneling of charges, thereby attaining lower power consumption.

Moreover, the memory functioning member may be a ferroelectric film whose polarization direction is changeable according to electric field. The ferroelectric film may be PZT (Lead Zirco-Titanate) family ferroelectric film, PLZT (Lead Zirco-Titanate) family ferroelectric film, or the like film. In this arrangement, polarization causes generation of charges substantially on a surface of the ferroelectric film. The charges thus generated are held. Therefore, it is possible to attain the hysteresis property that is similar to the hysteresis property attained by a film having a function to trap charges supplied from an outside of a film having a memory function. Furthermore, in order to hold the charges therein, the ferroelectric film needs no external supply of the charges in this arrangement. The ferroelectric film can attain the hysteresis property simply by polarization of the charges inside the film. Thus, fast writing (programming) and erasing can be realized by this arrangement. Therefore, this arrangement is preferable.

Note that it is appropriate to arrange the insulating film included in the memory functioning member such that it is a region from which the charges hardly leak out, or a film having a function of making it difficult for the charges to leak out. For example, a silicon oxide film or the like has the function of making it difficult for the charges to leak out.

The charge holding film to be included in the memory functioning member is provided directly on each side of the gate electrode. Alternatively, the charge holding film is provided indirectly on each side of the gate electrode with the insulating film sandwiched between the charge holding film and the gate electrode. Further, the charge holding film is provided on the gate insulating film (semiconductor substrate, well region, body region, source region, drain region or diffusion region) indirectly or directly, that is, with or without a gate insulating film sandwiched therebetween. It is preferable that the side walls of the gate electrode are partially or wholly covered with (i) the charge holding films provided directly thereon or (ii) the charge holding films provided indirectly thereon with the insulating film sandwiched between the charge holding film and the side wall of the gate electrode. As a specific example of usage, if the gate electrode has a recess section in its bottom end portion, the charge holding film may be formed such that the recess section is partially or completely filled with (i) the charge holding film provided directly on the gate electrode or (ii) the charge holding film provided indirectly on the gate electrode with the insulating film sandwiched between the charge holding film and the gate electrode.

The diffusion region may function as the source region and drain region, and has opposite conductivity to that of the semiconductor layer or the well region. It is preferable that impurity concentration changes steeply over the junction between the diffusion region and the conductive layer or the well region. This arrangement makes it possible to attain efficient generation of hot electrons or hot holes by using a low voltage, thereby attaining a high-speed operation by using a lower electrode. The diffusion region is not particularly limited in terms of depth of its junction. Thus, the depth of the junction of the diffusion region may be arbitrarily adjusted depending on properties and the like of the semiconductor storage device to be obtained. In case where the semiconductor substrate is an SOI substrate, the depth of the junction of the diffusion region may be shallower than a thickness of the top-layer semiconductor layer. However, it is preferable that the depth of the junction is approximately equivalent to the thickness of the top-layer semiconductor layer.

The diffusion regions may be so provided as to (i) overlap an end of a gate electrode, (ii) be located on the end of the gate electrode but not beyond the end of the gate electrode, or (iii) be offset with respect to the gate electrode terminal. Especially in the case where the diffusion region is offset with respect to the gate electrode terminal, an offset region under the charge holding film is reversed when a voltage is applied on the gate electrode. An amount of the charges accumulated in the memory functioning member largely changes how easily the offset region is reversed. Thus, in the case where the diffusion region is offset with respect to the gate electrode terminal, a higher memory effect and reduction in short-channel effect are attained. Therefore, it is preferable that the diffusion region is offset with respect to the gate electrode terminal. However, if the diffusion region is offset too much, a driving current across the diffusion region (between source and drain) becomes significantly small. Therefore, it is preferable that an offset amount (a distance in a gate length direction between one gate electrode terminal and the diffusion region that is closer to the gate electrode terminal) is shorter than a thickness of the charge holding film, the thickness being parallel to the gate length direction. It is especially important that at least part of the charge holding film (a film having the charge holding function) in the memory functioning member overlaps part of the diffusion region. This is important because the memory element constituting the semiconductor storage device performs its data rewriting operation by using an electric field across the memory functioning member, the electric field generated by an voltage difference between the gate electrode and the diffusion region, the voltage difference existing only on the side wall of the memory functioning member.

The diffusion region may be so arranged that part of the diffusion region is located on a surface of the channel region, that is, in a position higher than a lower surface of the gate insulating film. In this arrangement, it is appropriate that a conductive film integrated with the diffusion region is provided on the diffusion region formed in the semiconductor substrate. The conductive film is, for example, made of (i) a semiconductor such as polysilicon, amorphous silicon, or the like, (ii) a silicide, (iii) any one of the above-mentioned metals and the metals having a high melting point, or (iv) the like. Of those materials, polysilicon is most preferable. Polysilicon has an impurity diffusion rate much greater than that of the semiconductor layer. Because of this, the use of polysilicon makes it easier to attain the diffusion region whose junction has a shallower depth in the semiconductor layer. This makes it easier to suppress the short channel effect. Note that, in this arrangement, at least part of the memory functioning member is sandwiched between the gate electrode and the part of the diffusion region.

The memory element of the present embodiment may be formed via a semiconductor process generally used, for example by a method similar to a method of forming a single-layered or laminated structured side wall spacer on the side wall of the gate electrode. Specifically, the memory element may be formed by the following methods: (1) after forming the gate electrode, formed is a single-layered film or a laminate film including the film (hereinafter "charge holding film") having the function of holding the charge (the single-layered film or a laminate film may be a single layer of the charge holding film, a laminate film structured as the charge holding film/the insulating film, a laminate film structured as the insulating film/charge holding film, a laminate film structured as the insulating film/charge holding film/insulating film, and the like film). And then, the film is etched backed under an appropriate condition so that the film retains a side-wall-spacer-like shape; (2) one of the insulating film and the charge holding film is formed and then etched back under an appropriate condition so that the film retains the shape of the, side wall spacer. Thereafter, the other one of the insulating film and the charge holding film is formed and then etched back similarly so that the film retains the side-wall-spacer-like shape; (3) an insulating film material in which particles of a charge holding material are dispersed is applied or deposited on the semiconductor layer including the gate electrode, thereby forming a film of the insulating material. The film is etched back under an appropriate condition so that the insulating film material retains the side-wall-spacer-like shape; (4) after forming the gate electrode, the single-layered film or the laminated film mentioned above is formed, and then subjected to patterning by using a mask; and (5) the like methods. Moreover, the memory element may be formed by the following method or the like method: before forming the gate electrode, formed is the charge holding film, the laminate film structured as charge holding film/insulating film, the laminate film structured as insulating film/charge holding film/insulating film, or the like film. And then, an aperture is formed in a region that is to be the channel region of the film. After that, the film of the gate electrode material is formed all over the aperture. Subsequently, the film of the gate electrode material is patterned in a shape that includes the aperture and is larger than the aperture.

How to form the memory element in this method is explained below, referring to a memory element shown in FIG. 8. To begin with a gate insulating film 214 and a gate electrode 217 are formed on a semiconductor substrate 211 via a well-known process. Next, on a whole surface of the semiconductor substrate 211, a silicon oxide film 241 is formed by the thermal oxidation method or deposited by the CVD (Chemical Vapor Deposition) method. The silicon oxide film 241 has a thickness of 0.8 nm to 20 nm, preferably of 3 nm to 10 nm. Then, on a whole surface of the silicon oxide film 241, a silicon nitride film 242 is deposited by the CVD method, the silicon nitride film 242 having a thickness of 2 nm to 15 nm, preferably of 3 nm to 10 nm. Further, on a whole surface of the silicon nitride film, a silicon oxide film 243 having a thickness in a range of 20 nm to 70 nm is formed by the CVD method. In this way, a laminate of silicon oxide film/silicon nitride film/silicon oxide film is formed.

Next, the laminate of silicon oxide film/silicon nitride film/silicon oxide film is etched back by anisotropic etching. Thereby, memory functioning members 261 and 262 having the side-wall-spacer-like shape are formed on the gate electrode 217. The thus formed memory functioning members 261 and 262 are suitable for recording operation.

After that, diffusion regions (source/drain regions) 212 and 213 are formed by ion introduction during which the gate electrode 217 and the memory functioning members 261 and 262 having the side-wall-spacer-like shape are used as masks. After the formation of the diffusion regions 212 and 213, the silicide process and the process of forming upper wiring are performed via the well known process.

In case where a memory cell array is formed by arraying the memory elements of the present embodiment, a best arrangement of the memory element (devices) satisfy all of the followings requirements, for example: (1) gate electrodes of a plurality of memory elements are connected together and function as a word line; (2) memory functioning members are provided respectively on both sides of the word line; (3) an insulator, especially a silicon nitride film has a function of holding charges in each memory functioning member; (4) the memory functioning members are formed from ONO (Oxide Nitride Oxide) films, and the silicon nitride film has a surface that is substantially parallel to a surface of the gate insulating film; (5) the silicon nitride film inside the memory functioning member is separated from the word line and a channel region by a silicon oxide film; (6) the silicon nitride film inside the memory functioning member overlaps a diffusion region; (7) the insulating film and the gate insulating film are different in thickness, the insulating film separating, from the channel region or a semiconductor layer, the silicon nitride film having the surface that is substantially parallel to the surface of the gate insulting film; (8) writing and erasing operations of a memory element is carried out by a word line; (9) no electrode (word line) having a function of assisting the writing and erasing operations is provided on the memory functioning member; and (10) areas right under the memory functioning members and adjacent to the diffusion region respectively have high concentrations of impurity that is of the other conductivity type than the conductivity type of the diffusion region. The memory element (devices) is, however, only required to satisfy at least one of the requirements.

An especially preferable combination of the requirements is, for example, a combination of (3) the insulating body, especially the silicon nitride film has the function of holding charges in each memory functioning member; (6) the silicon nitride film inside the memory functioning member overlaps on the diffusion region; and (9) no electrode (word line) having the function of assisting the writing and erasing operations is provided on the memory functioning member.

The combination of the requirements (3) and (9) is very advantageous as descried below.

To begin with, it is possible to arrange such that a bit line contact is provided closer to the memory functioning member provided on a side of the word line. Thus, data stored in memory functioning members can be maintained because the memory functioning members do not touch each other even when the memory elements get closer to each other. Therefore, the combination of the requirements (3) and (9) makes it easier to attain a finer memory element (devices). Note that in case where charge holding regions in the memory functioning member are made of a conductor, the charge holding regions interfere each other as the memory elements get closer to each other due to capacitor coupling. As a result, the data stored in the memory functioning member cannot be maintained.

Moreover, in case where the charge holding region in the memory functioning member is an insulator (for example, the silicon nitride film), there is no need of separating a memory functioning member per memory cell. For example, memory functioning members provided on both the sides of one word line and shared between/among a plurality of memory cells need not be parted for each memory cell, and may be shared between/among the plurality of memory cells sharing the word line. Because of this, there is no need of photo-etching process that is for parting the memory functioning member. Therefore, it is possible to attain a simpler manufacturing process. Furthermore, there is no need of allowing margins for positioning in the photolithography process and for film loss caused by the etching. Therefore, it is possible to arrange the memory cells to have a smaller margin between them. Thus, if the memory cells are microfabricated to the same extent, the arrangement in which the charge holding area is an insulator, requires a smaller occupying area for the memory cells, compared with the arrangement in which the charge holding area in the memory functioning member is a conductor (for example, a polycrystalline silicon film). Note that the arrangement in which the charge holding area in the memory functioning member is a conductor requires the photo-etching process for parting the memory functioning member per memory cell, thus requiring a margin for positioning during light-exposure and for film loss caused by the etching.

Furthermore, in the arrangement in which the charge holding area is an insulator, no electrode having a function of assisting the writing and erasing operations is provided on the memory functioning member, and thus this arrangement has a simpler structure for its elements. On account of this, it is possible to produce the semiconductor storage device with a higher yield via production process having a less number of steps therein. Thus, it is possible to attain a semiconductor storage device in which the memory cell is easily mounted together with a transistor constituting a logic circuit or an analog circuit, and that has a low cost.

Moreover, the arrangement in which not only the requirements (3) and (9) but also the requirement (6) is satisfied is more effective. With the arrangement in which the charge holding region in the memory functioning member overlaps the diffusion region, it is possible to perform the writing and erasing operations by using a very low voltage. Specifically, it is possible to carry out the writing and erasing operations by using a voltage of 5V or less. This advantage is quite effective in designing circuits. Because it is unnecessary to generate a high voltage in this arrangement unlike a flash memory, it is possible to omit or scale down a charge-pumping circuit that requires a huge occupying area. Especially, in case where, in a logic LSI, a memory section of small capacity is provided, for adjustment, a periphery circuit for driving a memory cell dominates in an occupying area of the memory section, rather than the memory cell. Therefore, for attaining a smaller chip size, it is most effective to omit or scale down a voltage-boosting circuit used for the memory cell.

On the other hand, in case where the requirement (3) is not satisfied, that is, where in the memory functioning member a section for holding charges is a conductor, it is possible to carry out the writing operation, even if the requirement (6) is not satisfied, that is, even if the conductor in the memory functioning member does not overlap the diffusion region. This is because the writing operation is assisted by capacitor coupling between (i) the conductor in the memory functioning member and (ii) the gate electrode. Moreover, in case where the requirement (9) is not satisfied, that is, where an electrode having the function of assisting the writing and erasing operations is provided on the memory functioning member, it is possible to perform the writing operation, even if the requirement (6) is not satisfied, that is, even if the conductor in the memory functioning member does not overlap on the diffusion region.

In the present semiconductor storage device, one of or both of the memory elements may be connected with a transistor. Further, the memory elements may be mounted, on one chip, together with a logic transistor. In those arrangements, the semiconductor storage device, especially, the memory element can be produced in a step that is highly compatible with a formation process of a standard transistor such as the transistor, the logic transistor, or the like. Thus, it is possible to form (i) the semiconductor device, especially the memory element, and (ii) the transistor or the logic transistor, in the same step. Therefore, it is possible to employ a very simple process in order to mount, on one chip, (i) the memory element and (ii) the transistor or the logic transistor. Thus, it is possible to attain, at a low cost, a device on which (i) the memory element and (ii) the transistor or the logic transistor are mounted together.

The present semiconductor storage device is so arranged that the memory element is capable of storing data of binary or more in each memory functioning member, and the memory element thereby stores quaternary or more. Note that the memory element may store binary data. Moreover, the memory element may have a function as a memory cell that acts as both a selection transistor and a memory by utilizing variable resistance property of the memory functioning member.

The present semiconductor storage device, by being combined with a logic element or a logic circuit, can be used in electronic apparatuses as follows: (1) data processing systems for personal computers, notebook-type computers, laptop-type computers, personal digital assistants/personal communicators, minicomputers, work stations, mainframes, multiprocessor computers, any others types of computers, and the like; (2) electronic parts constituting data processing systems for CPUs, memories, data storage devices, and the like; (3) communication apparatuses such as telephones, PHSs (devices for the personal handy-phone system), modems, routers, and the like; (4) image display apparatuses such as display panels, projectors and the like; (5) offices machines such as printers, scanner, photocopying machines; (6) imaging apparatuses such as video cameras, digital cameras, and the like; (7) entertainment/amusement apparatuses such as game machines, music players, and the like; (8) information apparatuses such as portable information terminals, watches/clocks, electronic dictionaries, and the like; (9) apparatus for use in automobiles, such as car navigation system devices, car audio devices, and the like; (10) audiovisual apparatuses for recording/reproducing data for moving pictures, still pictures, music (sounds) and the like; (11) electric appliances such as washing machines, microwave ovens, refrigerators, rice cookers, dish washers, cleaners, air conditioners, and the like; (12) apparatuses for health care, such as massaging apparatuses, weighing machines, blood-pressure meters, and the like; (13) portable storage devices such as IC cards, memory cards and the like; (14) and the like. Especially, the present semiconductor storage device is effectively applicable in portable electronic apparatuses such as portable telephones, portable information terminals, IC cards, memory cards, portable computers, portable game machines, digital cameras, portable moving-picture players, portable music players, electronic dictionaries, watches, and the like. Note that the present semiconductor storage device may be built, as at least part of a control circuit or a data storage circuit, in the electronic apparatuses, or may be detachably provided in electronic apparatuses.

[Embodiment 1]

A semiconductor storage device of the present embodiment includes a memory element 1 as shown in FIG. 1.

The memory element 1 is arranged such that a gate electrode 104 is formed via a gate insulating film 103 on a P-type well region 102 which is formed on the surface of a semiconductor substrate 101. On the upper surface and side surfaces of the gate electrode 104, arranged is a silicon nitride film 109 which is a charge holding film, holding charges at a trap level. The portions of the silicon nitride film 109 on the both side walls serve as memory functional sections 105a and 105b where charges are actually held. Here, the memory functional section indicates a section where charges are actually accumulated by rewriting operation in a memory functioning member or a charge holding film. In the P-type well region 102 on the opposite sides of the gate electrode 104, formed are N-type diffusion regions 107a and 107b which function as source region or drain region. The diffusion regions 107a and 107b have an offset structure. That is, neither the diffusion regions 107a nor 107b extend to a region 121 under the gate electrode 104, and offset regions 120 under the charge holding film constitute a part of the channel region.

Note that, the memory functional sections 105a and 105b substantially holding charges are portions on both side walls of the gate electrode 104. Therefore, only the regions corresponding to these portions should include the silicon nitride film 109 formed thereon (see FIG. 2(a)). The memory functional sections 105a and 105b may have a structure in which fine particles 111 each realized by a nanometer-size electric conductor or semiconductor are dispersed in an insulating film 112 (see FIG. 2(b)). At this moment, the fine particle 111 having a diameter of less than 1 nm, which produces quantum effects that are to large, makes it difficult such that a charge tunnels through a dot. However, the fine particle 111 having a diameter of more than 10 nm do not produce significant quantum effects at room temperature. Therefore, it is preferable that the fine particle 111 is in the 1 nm to 10 nm diameter range. Moreover, the silicon nitride film 109, a charge holding film, may be formed in a sidewall-spacer manner on the side surfaces of the gate electrode (see FIG. 3).

A principle of the writing operation by a memory element will be described with reference to FIG. 3 and FIG. 4. Note that, the following description is given based on the case where both of first memory functioning member 131a and second memory functioning member 131b have functions of holding charges. Writing operation indicates an operation of injecting electrons into the memory functioning members 131a and 131b when the memory element is a N-channel type memory element. The following description assumes that the memory element is a N-channel type memory element.

Figure 3:
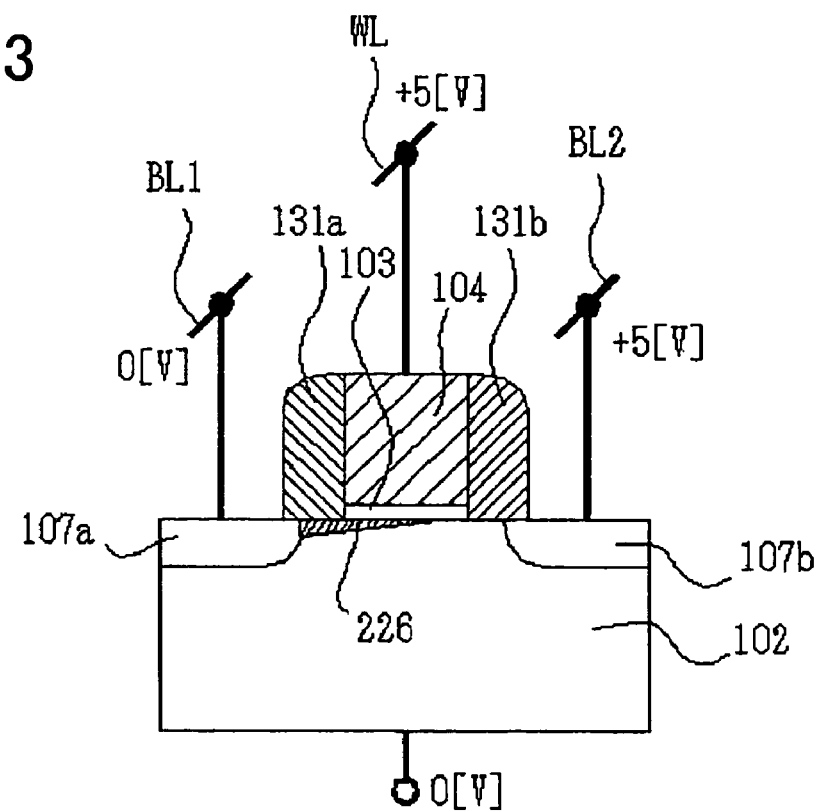
FIG. 3 is a diagram explaining writing operation of the memory element in the semiconductor storage device of Embodiment 1 of the present invention.

For injection (writing) of electrons into the second memory functioning member 131b, assume that an N-type first diffusion region 107a is a source electrode, and an N-type second diffusion region 107b is a drain electrode, as shown in FIG. 3. For example, a voltage of 0V is applied to the N-type first diffusion region 107a and the P-type well region 102, a voltage of +5V is applied to the N-type second diffusion region 107b, and a voltage of +5V is applied to the gate electrode 104. Under such voltage conditions, an inversion layer 226 extends from the first diffusion region 107a (source electrode), but it does not reach the second diffusion region 107b (drain electrode), which causes a pinch-off point. Electrons are accelerated from the pinch-off point to the second diffusion region 107b (drain electrode) with the application of a high electric field, thus turning to so-called hot electrons (high-energy conduction electrons). These hot electrons are injected into the second memory functioning member 131b, whereby writing operation is carried out. Note that, no hot electrons occur near the first memory functioning member 131a, hence writing operation is not carried out.

Figure 4:
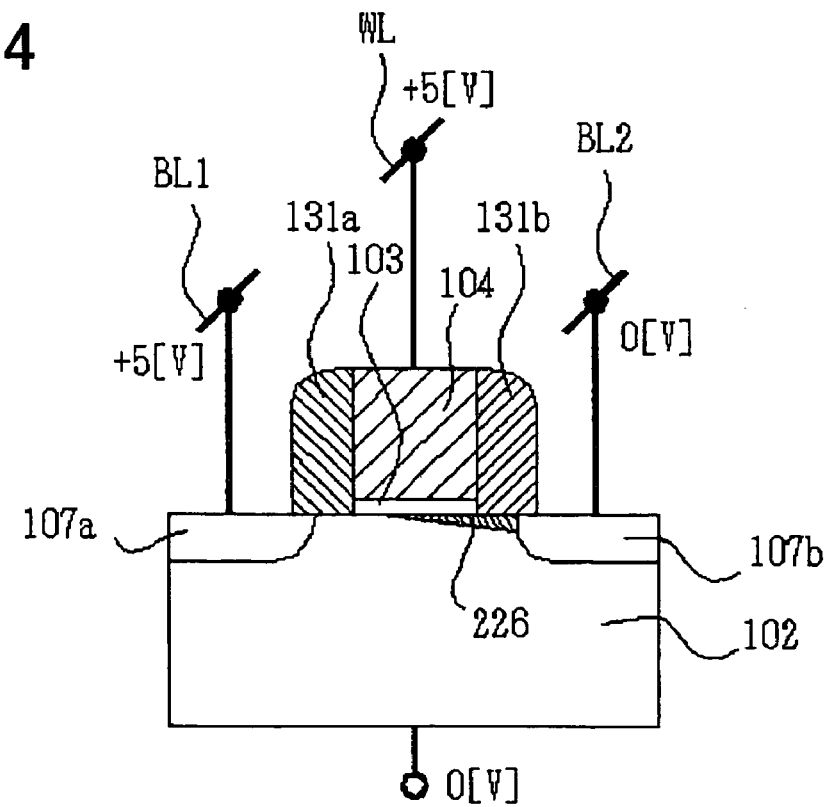
FIG. 4 is a diagram explaining another writing operation of the memory element in the semiconductor storage device of Embodiment 1 of the present invention.

Meanwhile, for injection (writing) of electrons into the first memory functioning member 131a, assume that the second diffusion region 107b is a source electrode, and the first diffusion region 107a is a drain electrode, as shown in FIG. 4. For example, a voltage of 0V is applied to the second diffusion region 107b and the P-type well region 102, a voltage of +5V is applied to the first diffusion region 107a, and a voltage of +5V is applied to the gate electrode 104. Thus, places between source region and drain region are changed from the places in the case when electrons are injected into the second memory functioning member 131b, whereby electrons are injected into the first memory functioning member 131a, thus carrying out writing operation.

Figure 5:
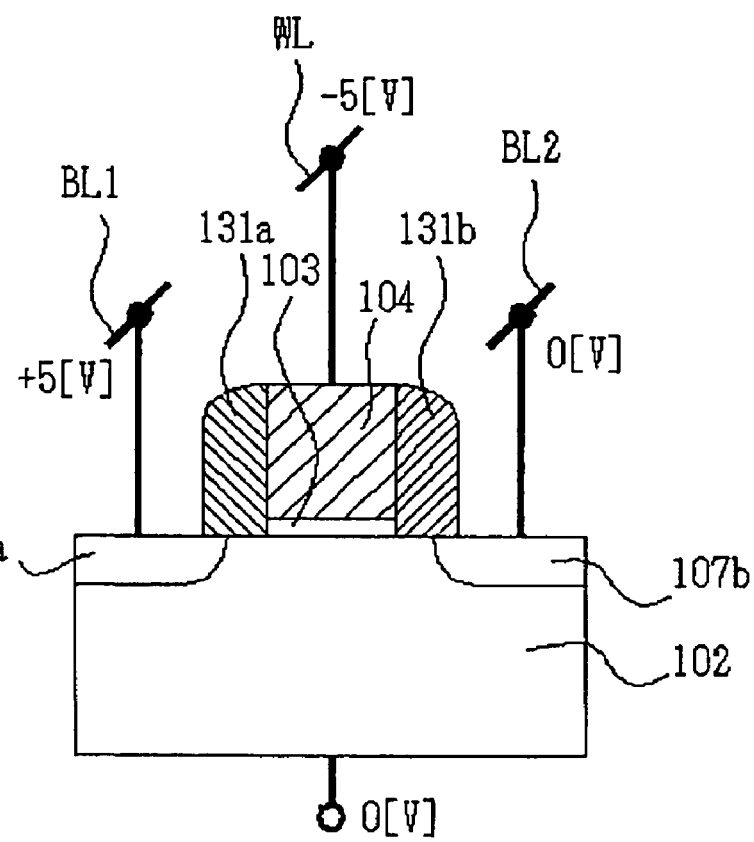
FIG. 5 is a diagram explaining erasing operation of the memory element in the semiconductor storage device of Embodiment 1 of the present invention.
Figure 6:
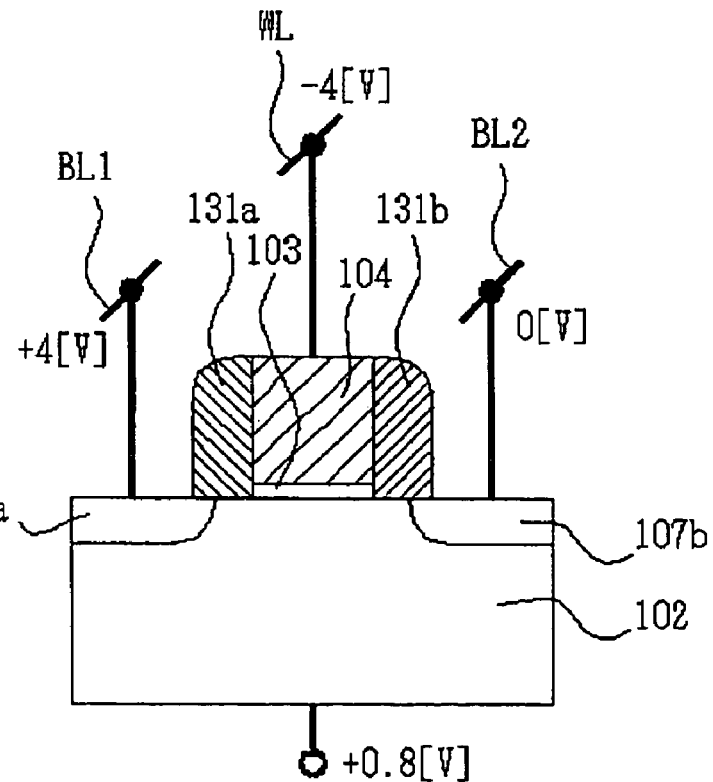
FIG. 6 is a diagram explaining another erasing operation of the memory element in the semiconductor storage device of Embodiment 1 of the present invention.

Next, the following will describe a principle of an erasing operation in the memory element with reference to FIG. 5 and FIG. 6.

In the first erasing method of erasing information stored in the first memory functioning member 131a, as shown in FIG. 5, a positive voltage (for example, +5V) is applied to the first diffusion region 107a, and a voltage of 0V is applied to the P-type well region 102 so that a p-n junction between the first diffusion region 107a and the P-type well region 102 is reverse biased, and further, a negative voltage (for example, −5V) is applied to the gate electrode 104. At this moment, because of application of the negative voltage to the gate electrode, a potential gradient especially becomes steep in the vicinity of the gate electrode 104 of the p-n junction. Therefore, hot holes (high-energy positive holes) are induced in the P-type well region 102 of the p-n junction by band-to-band tunneling. The hot holes are attracted in the direction of the gate electrode 104 having negative potential, which results in hole injection in the first memory functioning member 131a. In this manner, erasing operation in the first memory functioning member 131a is carried out. In this case, it is safe for a voltage of 0V to be applied to the second diffusion region 107b.

For erasing of information stored in the second memory functioning member 131b, it is safe for potentials to be changed between the first diffusion region and the second diffusion region in the above first method. In the second erasing method of erasing information stored in the first memory functioning member 131a, as shown in FIG. 6, a positive voltage (for example, +4V) is applied to the first diffusion region 107a, a voltage of 0V is applied to the second diffusion region 107b, a negative voltage (for example, −4V) is applied to the gate electrode 104, and a positive voltage (for example, +0.8V) is applied to the P-type well region 102. At this moment, a forward voltage is applied between the P-type well region 102 and the second diffusion region 107b, causing electrons to be injected into the P-type well region 102. The injected electrons are diffused to the p-n junction between the P-type well region 102 and the first diffusion region 107a and then accelerated with the application of a strong electric field, thus turning to hot electrons. These hot electrons cause electron-hole pairs generated at the p-n junction. That is, application of a forward voltage between the P-type well region 102 and the second diffusion region 107b causes electrons injected into the P-type well region 102 to trigger the generation of hot holes at the p-n junction located on the opposite side. The hot holes generated at the p-n junction are attracted in the direction of the gate electrode 104 having negative potential, which results in hole injection in the first memory functioning member 131a.

According to the method, at the p-n junction between the P-type well region and the first diffusion region 107a, even when a voltage insufficient for the induction of hot holes by band-to-band tunneling is applied, the electrons injected from the second diffusion region 107b trigger the generation of electron-hole pairs at the p-n junction, thus generating hot holes. This makes it possible to decrease a voltage during the erasing operation. Especially, if there exists an offset region 120 (see FIG. 1), the gate electrode to which a negative potential is applied reduces the effect of providing a sharp p-n junction. This has a difficulty of inducing hot holes by band-to-band tunneling; however, the second method compensates for this drawback, thus realizing erasing operation at a low voltage.

Note that, for erasing of information stored in the first memory functioning member 131a, the first erasing method requires a voltage of +5V applied to the first diffusion region 107a. However, in the second erasing method, a voltage of +4V is enough for the erasing. Thus, according to the second erasing method, it is possible to decrease a voltage during the erasing operation, so that power consumption is reduced, thus suppressing deterioration of the memory element caused by hot carriers.

Moreover, both erasing methods are less prone to causing overerase phenomenon. The overerase phenomenon is a phenomenon in which as the amount of positive holes accumulated in a memory functioning member increases, a threshold value decreases without saturating. For EEPROM typified by flash memory, the overerase phenomenon is a big problem and causes such a fatal malfunction that selection of memory cell is impossible especially when the threshold value becomes negative. On the other hand, in the memory element of the present semiconductor storage device, a large amount of positive holes accumulated in the memory functioning member only induces electrons under the memory functioning member and has little influence on the potential of the channel region under the gate insulating film. The threshold value during the erasing operation is determined depending on the potential under the gate insulating film, thus it is more likely that no overerase phenomenon occurs.

Figure 7:
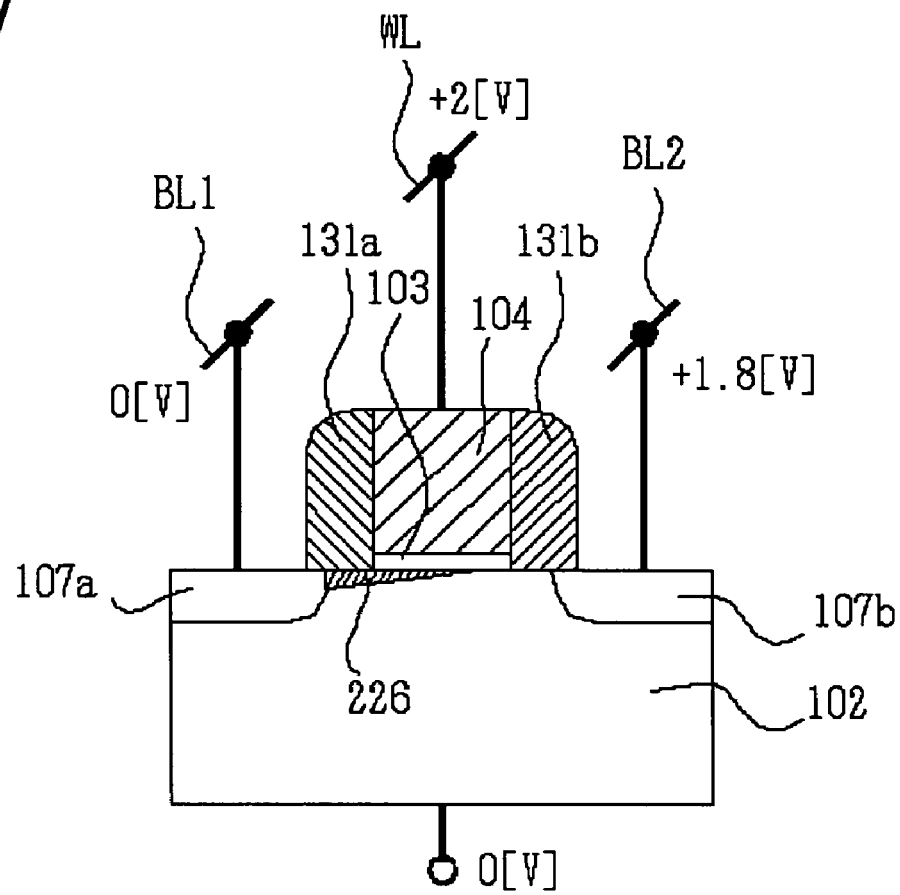
FIG. 7 is a diagram explaining read-out operation of the memory element in the semiconductor storage device of Embodiment 1 of the present invention.

Furthermore, the following will describe a principle of read-out operation in the memory element with reference to FIG. 7.

For read-out of information stored in the first memory functioning member 131a, a transistor is activated under the condition where the first diffusion region 107a is a source electrode, and the second diffusion region 107b is a drain electrode. For example, a voltage of 0V is applied to the first diffusion region 107a and the P-type well region 102, a voltage of +1.8V is applied to the second diffusion region 107b, and a voltage of +2V is applied to the gate electrode 104. At this moment, when electrons are not accumulated in the first memory functioning member 131a, a drain current is more likely to flow. On the other hand, when electrons are accumulated in the first memory functioning member 131a, an inversion layer is less prone to being generated in the vicinity of the first memory functioning member 131a, so that a drain current is less prone to flowing. Therefore, it is possible to read out information stored in the first memory functioning member 131a by detecting a drain current. Especially, in the case where information is read out with the application of such a voltage that would effect pinch-off operation, the state of charges accumulated in the first memory functioning member 131a can be judged with higher accuracy regardless of the presence or absence of charges accumulated in the second memory functioning member 131b.

For read-out of information stored in the second memory functioning member 131b, a transistor is activated under the condition where the second diffusion region 107b is a source electrode, and the first diffusion region 107a is a drain electrode. For example, it is safe for a voltage of 0V to be applied to the second diffusion region 107b and the P-type well region 102, a voltage of +1.8V to be applied to the first diffusion region 107a, and a voltage of +2V to be applied to the gate electrode 104. Thus, places between source region and drain region are changed from the places in the case when information stored in the first memory functioning member 131a is read out, whereby it is possible to read out information stored in the second memory functioning member 131b.

Note that, when there remains a channel region (offset region 120) not covered by the gate electrode 104, an inversion layer is erased or generated depending on the presence or absence of surplus charges in the memory functioning members 131a and 131b. As a result of this, a large hysteresis (change in threshold value) can be obtained. Note that, too much width of the offset region 120 causes a considerable decrease in the amount of drain current and a dramatic decrease in read-out speed. Therefore, it is preferable to determine a width of the offset region 120 so that sufficient hysteresis and read-out speed can be obtained.

In the case where the diffusion regions 107a and 107b reach the edges of the gate electrode 104, that is, in the case where the diffusion regions 107a and 107b overlap the gate electrode 104, a transistor exhibits little change in threshold value by writing operation, but exhibits a dramatic change in parasitic resistance at the edges of the source and drain regions, decreasing the amount of drain current (decreasing by one or more orders of magnitude). Therefore, read-out can be carried out by detecting a drain current, and it is possible to obtain functions serving as a memory. Note that, when larger hysteresis effect is required, it is preferable that the diffusion regions 107a and 107b do not overlap the gate electrode 104 (the offset regions 120 exist).

By the above operating methods, one transistor can selectively carry out 2-bit writing and erasing. Memory elements are arranged such that a word line WL, a first bit line BL1, and a second bit line BL2 are respectively connected to the gate electrode 104, the first diffusion region 107a, and the second diffusion region 107b in the memory element, thereby making up a memory cell array.

Moreover, in the above operating methods, a changing of places between source electrode and drain electrode realizes 2-bit writing and erasing in one transistor. However, places of the source electrode and drain electrode may be fixed so that the transistor can operate as one bit of memory. In this case, one of the source region and the drain region can be a common fixed voltage, thereby halving the number of bit lines connected to the source region and the drain region.

As is clear from the above description, in a memory element of the present semiconductor storage device, memory functioning members are provided independently from the gate insulating film and provided on the opposite sides of the gate electrode, so that 2-bit operations are possible. Further, since the memory functioning members are isolated from each other by the gate electrode, interference between them during writing operation is effectively suppressed. Still further, since the gate insulating film is isolated from the memory functioning members, the thickness of the memory functioning members is reduced, thereby suppressing a short channel effect. This facilitates realization of a finer memory element, and by extension, realization of a finer semiconductor storage device.

[Embodiment 2]

Figure 8:
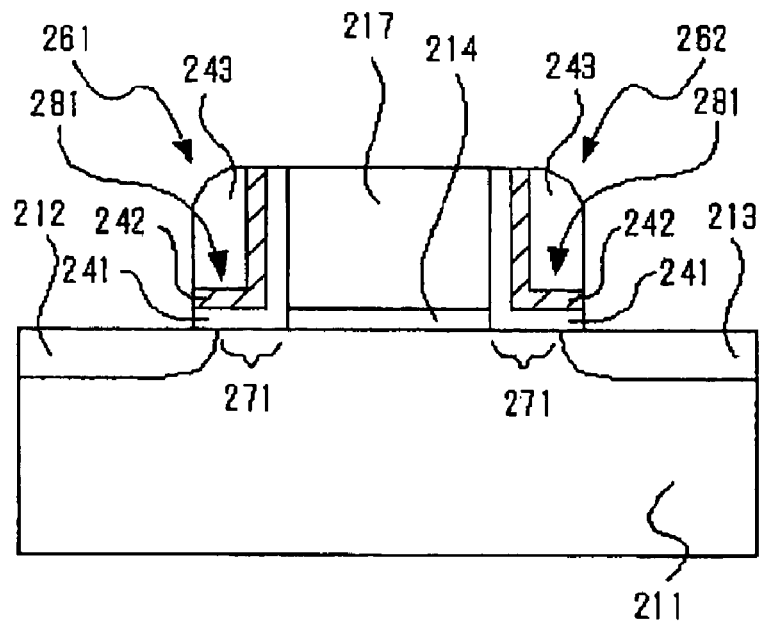
FIG. 8 is a cross-sectional diagram schematically showing a main part of a memory element in a semiconductor storage device of Embodiment 2 of the present invention.

A memory element in a semiconductor storage device of the present embodiment, as shown in FIG. 8, has substantially the same arrangement as that of the memory element 1 in FIG. 1, except for the arrangement in which each memory functioning members 261 and 262 is constituted by a region where charges are held (this region is a region where charges are accumulated and may be a film having a function of holding charges) and a region where charges are less prone to escaping (this region may be a film having a function of making charges less prone to escaping).

In terms of improvement in holding property of memory, the memory functioning members preferably include an insulating film and a charge holding film capable of holding charges. In the present embodiment, a silicon nitride film 242 having a level of trapping charges is used as a charge holding film, and silicon oxide films 241 and 243 capable of preventing the dissipation of charges accumulated in the charge holding film are used as insulating films. The memory functioning member including the charge holding film and the insulating films prevents the dissipation of charges, thereby improving a holding property. Moreover, as compared to the constitution of the memory functioning member including the charge holding film alone, the above constitution of the memory functioning member can reduce the volume of the charge holding film to an appropriately small volume, and can restrict transfer of charges inside the charge holding film, thereby suppressing changes of properties caused by the transfer of charges during memory holding. Further, the structure in which the silicon nitride film 242 is sandwiched between the silicon oxide films 241 and 243 enhances a charge injection efficiency during rewriting operation, thus allowing for a higher-speed operation. Note that, in this memory element, the silicon nitride film 242 may be substituted with a ferroelectric substance.

The regions where charges are held (silicon nitride film 242) in the memory functioning members 261 and 262 overlap diffusion regions 212 and 213, respectively. To "overlap" means that at least a part of the region where charges are held (silicon nitride film 242) exists above at least a part of each of the diffusion regions 212 and 213. Note that, reference numeral 211 represents a semiconductor substrate, reference numeral 214 represents a gate insulating film, reference numeral 217 represents a gate electrode, reference numeral 271 represents an offset region of the gate electrode 217 and each of the diffusion regions 212 and 213. An upper surface of the semiconductor substrate 211 beneath the gate insulating film 214 is a channel region (not shown). The following will describe effects brought by the arrangement where the silicon nitride films 242, which are regions where charges are held in the memory functioning members 261 and 262, overlap the diffusion regions 212 and 213.

Figure 9:
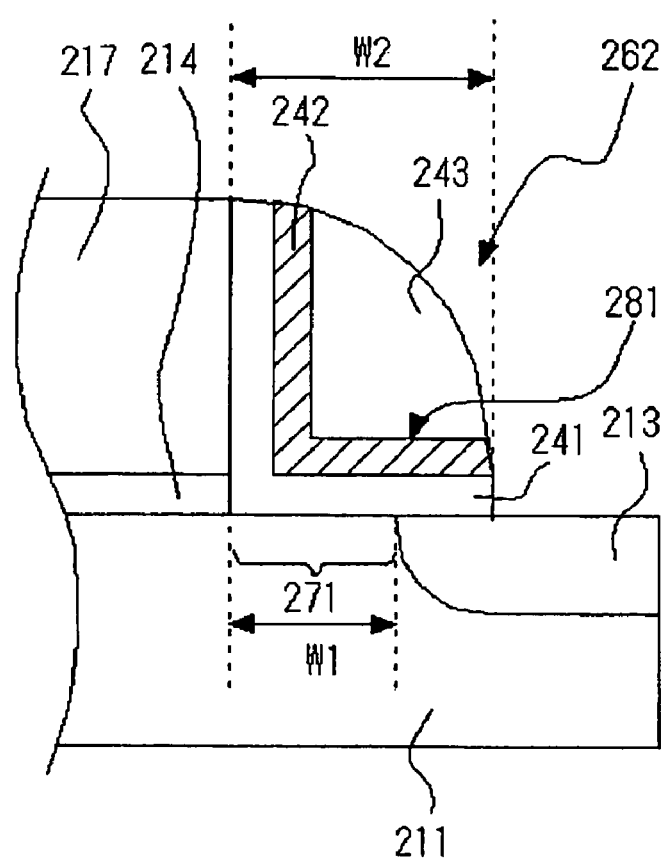
FIG. 9 is a magnified cross-sectional diagram of a main part of a modified memory element in FIG. 8.

As shown in FIG. 9, in the periphery of the memory functioning member 262, when the amount of offset between the gate electrode 217 and the diffusion region 213 is W1, and a width of the memory functioning member 262 in a cross section in the channel length direction of the gate electrode is W2, the amount of overlap between the memory functioning member 262 and the diffusion region 213 is expressed by W2−W1. Here, it is important that the part including the silicon nitride film 242 in the memory functioning member 262 overlaps the diffusion region 213, that is, the relation W2>W1 is satisfied.

Figure 10:
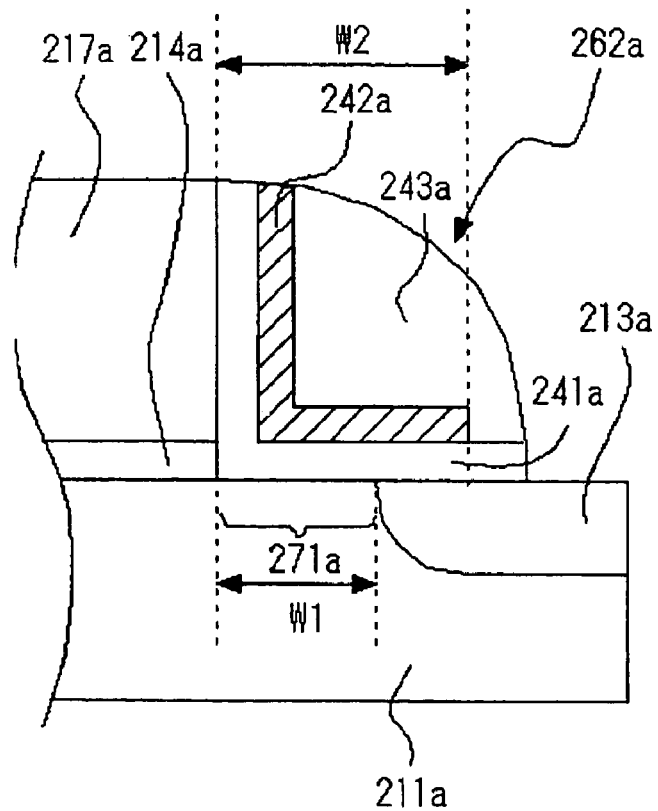
FIG. 10 is a magnified cross-sectional diagram of a main part of a modified memory element in FIG. 8.

In FIG. 9, a width of the memory functioning member 262 is denoted by W2 because the edge of the silicon nitride film 242 on the side distant from the gate electrode 217 matches the edge of the memory functioning member 262 on the side distant from the gate electrode 217. However, as shown in FIG. 10, when the edge of the silicon nitride film 242a on the side distant from the gate electrode does not match the edge of the memory functioning member 262a on the side distant from the gate electrode, W2 should be defined as the distance from the edge of the gate electrode to the edge of the silicon nitride film 242a on the side distant from the gate electrode.

Figure 11:
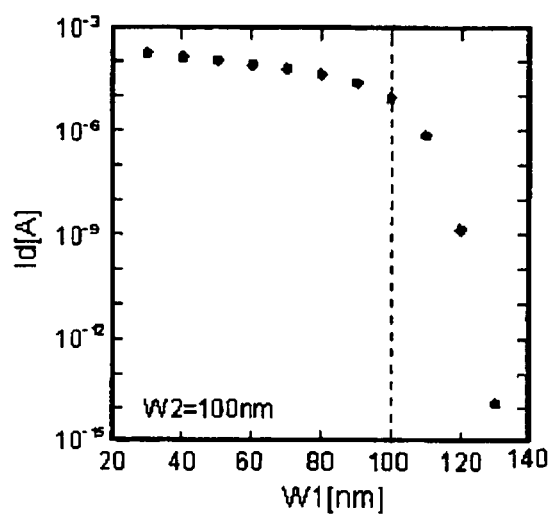
FIG. 11 is a graph showing an electric property of a memory element in a semiconductor storage device of Embodiment 2 of the present invention.

FIG. 11 shows a drain current Id with changes in the amount of offset W1 when the width W2 of the memory functioning member 262 is fixed to 100 nm in a structure of the memory element in FIG. 9. Here, values of the drain current were obtained by a device simulation under the condition where the memory functioning member 262 is in an erased state (includes holes accumulated therein) and the diffusion regions 212 and 213 are source electrode and drain electrode, respectively. As is apparent from FIG. 11, when W1 is 100 nm or more (that is, the silicon nitride film 242 does not overlap the diffusion region 213), the drain current decreases rapidly. The value of the drain current is appropriately in proportion to a read-out speed. Therefore, when W1 is 100 nm or more, the performance of memory is rapidly degraded. On the other hand, when W1 is a value in the range where the silicon nitride film 242 overlaps the diffusion region 213, the drain current decreases moderately. Therefore, considering that variations in mass production process, if at least a part of the silicon nitride film 242, which is a film capable of holding charges, does not overlap the source region and drain region, it is practically difficult to obtain memory function.

In view of the result of the above-mentioned device simulation, memory cell arrays with W1 of 60 nm and 100 nm as design value were prepared under the condition where W2 is fixed to 100 nm. When W1 is 60 nm, there is an overlap of 40 nm as a design value between the silicon nitride film 142 and the diffusion regions 212 and 213. When W1 is 100 nm, there is no overlap between them. When comparing to results of a read-out time measurement between these memory cell arrays in the worst cases considering variations, the memory cell array with W1 of 60 nm reads at a speed of 100 times faster in a read-out access time than the memory cell array with W1 of 100 nm. Practically, a read-out access time is preferably 100 nanoseconds or less per bit; however, when W1=W2, it is impossible to achieve this condition. In view of variations in manufacturing process, (W2−W1)>10 nm is more preferable.

For read-out of information stored in the memory functioning member 261 (region 281), as in the case of Embodiment 1, it is preferable that the diffusion region 212 and the diffusion region 213 are source electrode and drain region, respectively, and a pinch-off point is formed in the channel region, at a point closer to the drain region. That is, in reading out information stored in one memory functioning member of two memory functioning members, a pinch-off point is preferably formed in the channel region, in a region closer to the other memory functioning member. This makes it possible to detect information stored in the memory functioning member 261 at a good sensitivity regardless of storage conditions in the memory functioning member 262. This is a great factor for the realization of two-bit operation.

On the other hand, when information is let stored in only one memory functioning member of two memory functioning members, or when the two memory functioning members are used with the same storage conditions, the formation of a pinch-off point is not always needed for read-out operation. Note that, it is preferable that a well region (for N channel element, P-type well), not shown in FIG. 8, is formed on the surface of the semiconductor substrate 211. The formation of a well region facilitates control of other electric properties (property of withstanding voltage, junction capacitance, short channel effect) while optimizing impurity concentration in the channel region for memory operations (writing operation and read-out operation).

Figure 12:
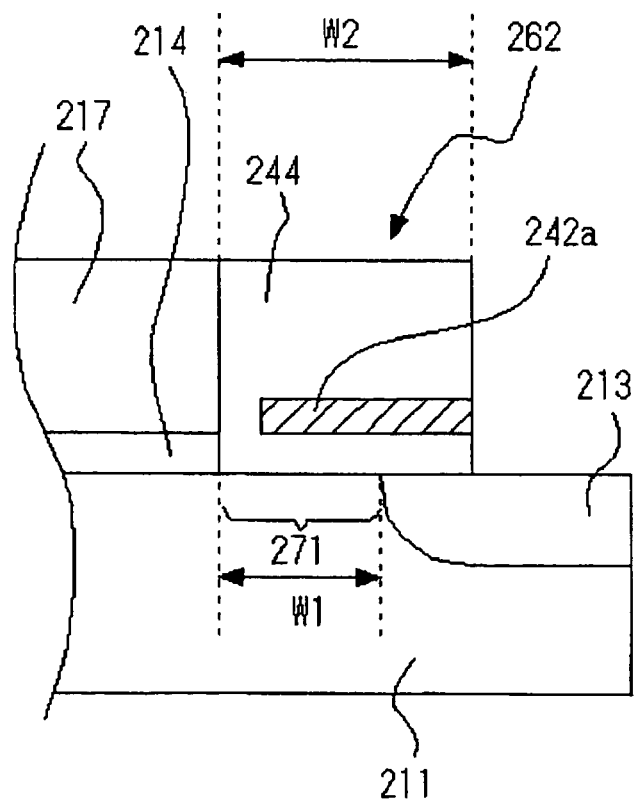
FIG. 12 is a cross-sectional diagram schematically showing a main part of a modified memory element in the semiconductor storage device of Embodiment 2 of the present invention.

It is preferable that the memory functioning member includes a charge holding film arranged substantially parallel to the surface of the gate insulating film. In other words, it is preferable that the upper surface of the charge holding film in the memory functioning member is arranged so as to be located at a place a given distance from the upper surface of the gate insulating film. Specifically, as shown in FIG. 12, the silicon nitride film 242a, which is a charge holding film in the memory functioning member 262, has a surface substantially parallel to the surface of the gate insulating film 214. In other words, it is preferable that the silicon nitride film 242a is formed at a uniform height from the level corresponding to the surface of the gate insulating film 214.

Existence of the silicon nitride film 242a which is substantially parallel to the surface of the gate insulating film 214 in the memory functioning member 262 can effectively control the tendency of forming an inversion layer in the offset region 271 by the amount of charges accumulated in the silicon nitride film 242a, and by extension can enhance a memory effect. Further, the arrangement in which the silicon nitride film 242a is substantially parallel to the surface of the gate insulating film 214 can reduce a change of memory effect to a relatively small change even when the amount of offset (W1) varies, thus suppressing varying degrees of memory effect. In addition, it is possible to suppress upward transfer of charges in the silicon nitride film 242a and to prevent changes in properties during memory holding, caused by transfer of charges.

Further, it is preferable that the memory functioning member 262 includes the insulating film (For example, a portion in the silicon oxide film 244 on the offset region 271) isolating the silicon nitride film 242a, which is substantially parallel to the surface of the gate insulating film 214, from the channel region (or well region). This insulating film prevents the dissipation of charges accumulated in the charge holding film, thus attaining a memory element having a much better holding property.

Note that, by controlling a film thickness of the silicon nitride film 242a and by controlling a film thickness of the insulating film (a portion of the silicon oxide film 244 above the offset region 271) beneath the silicon nitride film 242a to uniform thickness, it is possible to maintain a distance from the surface of the semiconductor substrate to charges accumulated in the charge holding film to a substantially uniform distance. That is, a distance from the surface of the semiconductor substrate to charges accumulated in the charge holding film can be controlled to a distance value between a minimum value of film thickness of the insulating film beneath the silicon nitride film 242a and a sum of a maximum value of film thickness of the insulating film beneath the silicon nitride film 242a and a maximum value of film thickness of the silicon nitride film 242a. This makes it possible to control a density of electric flux lines caused by charges accumulated in the silicon nitride film 242a and to extremely reduce varying degrees of memory effect of the memory element.

[Embodiment 3]

Figure 13:
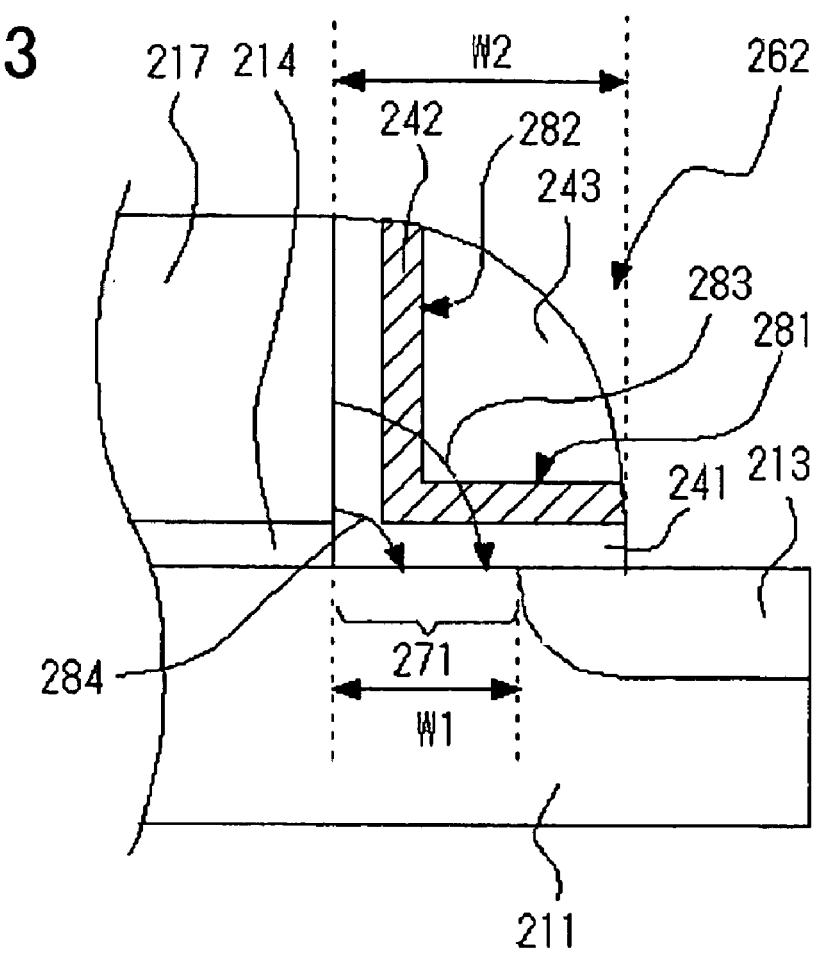
FIG. 13 is a cross-sectional diagram schematically showing a main part of a memory element in the semiconductor storage device of Embodiment 3 of the present invention.

As shown in FIG. 13, a memory functioning member 262 in the semiconductor storage device of the present embodiment includes a silicon nitride film 242, which is a charge holding film, with substantially uniform film thickness, having a region 281 which is arranged substantially parallel to the surface of the gate insulating film 214 and a region 282 which is arranged substantially parallel to the side surface of the gate electrode 217.

When a positive voltage is applied to a gate electrode 217, an electric flux line 283, as indicated by arrow, in a memory functioning member 262 passes through the silicon nitride film 242 twice (the region 282 and the region 281). Note that, when a negative voltage is applied to the gate electrode 217, an electric flux line reverses its direction. Here, the silicon nitride film 242 has a relative permittivity of approximately 6, and the silicon oxide films 241 and 243 have a relative permittivity of approximately 4. This arrangement of the present embodiment can make an effective relative permittivity in the direction of the electric flux line larger and make difference in potential between both ends of the electric flux line smaller than the arrangement in which the region 281 alone exists in the charge holding film. That is, a large part of the voltage applied to the gate electrode 217 is used to strengthen an electric field in the offset region 271.

Injection of charges into the silicon nitride film 242 during rewriting operation occurs because generated charges are attracted by an electric field in the offset region 271. Therefore, inclusion of the charge holding film indicated by the arrow 282 increases the amount of charges injected into the memory functioning member 262 during rewriting operation, thus increasing a rewriting speed. Note that, if the part corresponding to the silicon oxide film 243 is also a silicon nitride film, that is, the charge holding film is not at a uniform height with respect to the level of the surface of the gate insulating film 214, upward transfer of charges in the silicon nitride film becomes pronounced, resulting in degrading of holding property.

It is more preferable that the charge holding film is made up of dielectric material such as hafnium oxide having a very high relative permittivity, instead of silicon nitride film. Further, it is preferable that the memory functioning member further includes an insulating film (a portion in the silicon oxide film 241 above the offset region 271) isolating the charge holding film, which is substantially parallel to the surface of the gate insulating film, from a channel region (or well region). This insulating film prevents the dissipation of charges accumulated in the charge holding film, further enhancing holding property.

Moreover, it is preferable that the memory functioning member further includes an insulating film (a portion of the silicon oxide film 241 in contact with the gate electrode 217) isolating the gate electrode from the charge holding film extending substantially parallel to the side surface of the gate electrode. This insulating film prevents change in electric properties caused by injection of charges from the gate electrode to the charge holding film, thus enhancing reliability of a memory element. Further, as in the case of Embodiment 2, it is preferable that a film thickness of an insulating film (a portion of the silicon oxide film 241 above the offset region 271) beneath the silicon nitride film 242 is controlled to a uniform thickness, and a film thickness of an insulating film (a portion of the silicon oxide film 241 in contact with the gate electrode 217) arranged on the side surface of the gate electrode is controlled to a uniform thickness. This makes it possible to generally control a density of electric flux lines which are caused by charges accumulated in the silicon nitride film 242 and to prevent leakage of charges.

[Embodiment 4]

In the present embodiment, the following will describe optimization of a length of a gate electrode, a distance between memory functioning members, and a distance between a source region and a drain region in a memory element of a semiconductor storage device.

Figure 14:
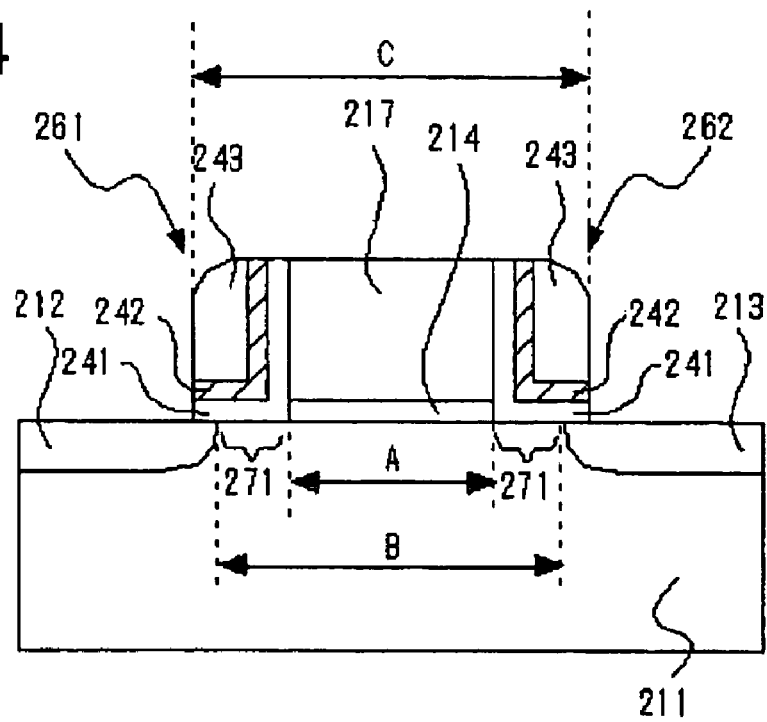
FIG. 14 is a cross-sectional diagram schematically showing a main part of a memory element in the semiconductor storage device of Embodiment 4 of the present invention.

As shown in FIG. 14, A denotes a length of a gate electrode in a cross section in the channel length direction, B denotes a distance (channel length) between a source region and a drain region, and C denotes a distance from the edge of one memory functioning member to the edge of the other memory functioning member, that is, a distance from the edge of a film capable of holding charges in one memory functioning member in a cross section in the channel length direction (the edge of the film which is distant from the gate electrode) to the edge of a film capable of holding charges in the other memory functioning member (the edge of the film which is distant from the gate electrode).

In such a memory element, B<C is preferable. By satisfying such a relation, there exists offset regions 271 between a part of the channel region located beneath the gate electrode 217 and a diffusion region 212 and between the part of the channel region located beneath the gate electrode 217a and a diffusion region 213. With this arrangement, in all of the offset regions 271, easiness of inversion effectively varies depending on charges accumulated in the memory functioning members 261 and 262 (silicon nitride films 242). This causes enhancement in memory effect and especially realizes speedup of read-out operation.

When there exists offsets between the gate electrode 217 and the diffusion region 212 and between the gate electrode 217 and the diffusion region 213, that is, when A<B, easiness of inversion in the offset regions when a voltage is applied to the gate electrode drastically varies depending on the amount of charges accumulated in the memory functioning members, thus realizing enhancement in memory effect, and especially reduction in short channel effect.

Incidentally, existence of the offset regions 271 is not always needed as long as memory effect shows up. In the case where the offset regions 271 do not exist, if impurity concentration in the diffusion regions 212 and 213 is low enough, memory effect can show up in the memory functioning members 261 and 262 (silicon nitride films 242). In view of this, A<B<C is the most preferable relation.

[Embodiment 5]

Figure 15:
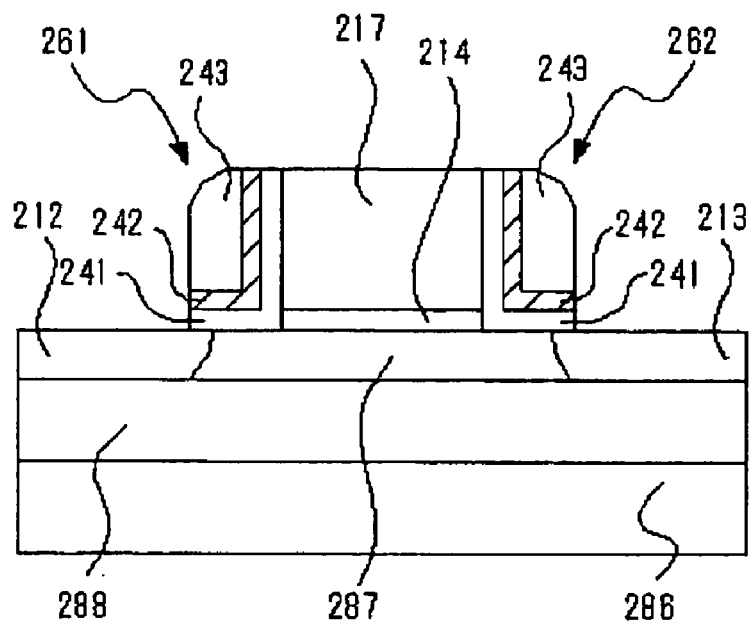
FIG. 15 is a cross-sectional diagram schematically showing a main part of a memory element in the semiconductor storage device of Embodiment 5 of the present invention.

As shown in FIG. 15, a memory element in a semiconductor storage device of the present embodiment has substantially the same arrangement as that of the memory element in Embodiment 2, except for the arrangement in which the semiconductor substrate in Embodiment 2 is replaced with a SOI substrate.

This memory element has an arrangement in which an embedded oxide film 288 is formed on a semiconductor substrate 286, and an SOI layer is further formed thereon. The SOI layer includes diffusion regions 212 and 213 and a body region 287 which is a region except for the diffusion regions 212 and 213 in the SOI layer.

This memory element can bring about the same effect as that of the memory element in Embodiment 2. Moreover, this memory element can significantly reduce the amount of junction capacitance of the diffusion regions 212 and 213 and the body region 287, thus allowing for speedup of a device and lower power consumption.

[Embodiment 6]

Figure 16:
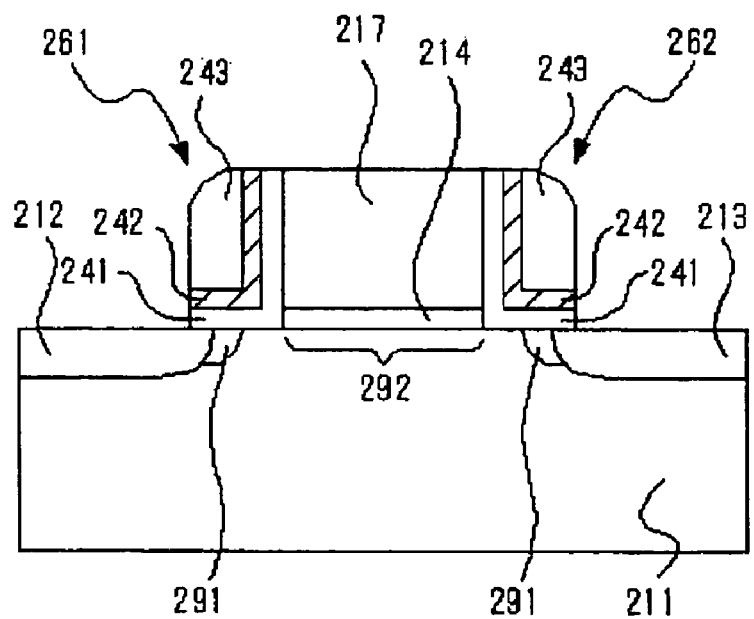
FIG. 16 is a cross-sectional diagram schematically showing a main part of a memory element in the semiconductor storage device of Embodiment 6 of the present invention.

As shown in FIG. 16, a memory element in a semiconductor storage device of the present embodiment has substantially the same arrangement as that of the memory element in Embodiment 2, except for the arrangement in which P-type high concentration regions 291 are additionally provided adjacent to ends of N-type diffusion regions 212 and 213 facing a channel region. More specifically, concentration of impurity giving a P-type nature (for example, boron) to the P-type high concentration regions 291 is higher than that of impurity giving a P-type nature to a region 292. Suitable P-type impurity concentration in the P-type high concentration regions 291 is, for example, in the order of $5 \times 10^{17}$ cm to $1 \times 10^{19}$ cm$^{-3}$. Also, P-type impurity concentration in the region 292 can be, for example, $5 \times 10^{16}$ cm to $1 \times 10^{18}$ cm$^{-3}$.

Thus, provision of the P-type high concentration regions 291 causes a sharp junction of the diffusion regions 212 and 213 and a semiconductor substrate 211 directly beneath the memory functioning members 261 and 262. Therefore, hot carriers are more likely to generate during writing and erasing operations, allowing for decrease in voltage for writing and erasing operations or speedups of writing and erasing operations. Further, a relatively low impurity concentration in the region 292 causes a low threshold value when memory is in a state of being erased, thus increasing the amount of drain current. This increases a read-out speed. Therefore, it is possible to obtain a memory element with a low rewriting voltage or a high rewriting speed, and a high read-out speed.

In FIG. 16, provision of the P-type high concentration regions 291 beneath the memory functioning members (that is, not directly beneath the gate electrode) in the vicinity of a source region and a drain region remarkably increases a threshold value of the entire transistor. An extent of this increase is remarkably larger than that in the case where there are the P-type high concentration regions 291 directly beneath the gate electrode. When writing charges (electrons in a case where the transistor is N-channel type transistor) are accumulated in the memory functioning member, the difference between the threshold values become much larger. On the other hand, when enough erasing charges (positive holes in a case where the transistor is N-channel type transistor) are accumulated in the memory functioning member, a threshold value of the entire transistor drops to a threshold value determined depending on impurity concentration in the channel region (region 292) beneath the gate electrode. That is, a threshold value during erasing operation does not depend on impurity concentration in the P-type high concentration regions 291, whereas a threshold value during writing operation is significantly affected by impurity concentration in the P-type high concentration regions 291. Therefore, arrangement of the P-type high concentration regions 291 beneath the memory functioning members in the vicinity of the source region and drain region remarkably varies only a threshold value during writing operation, thus allowing for significant enhancement in memory effect (difference in threshold value between writing operation and erasing operation).

[Embodiment 7]

Figure 17:
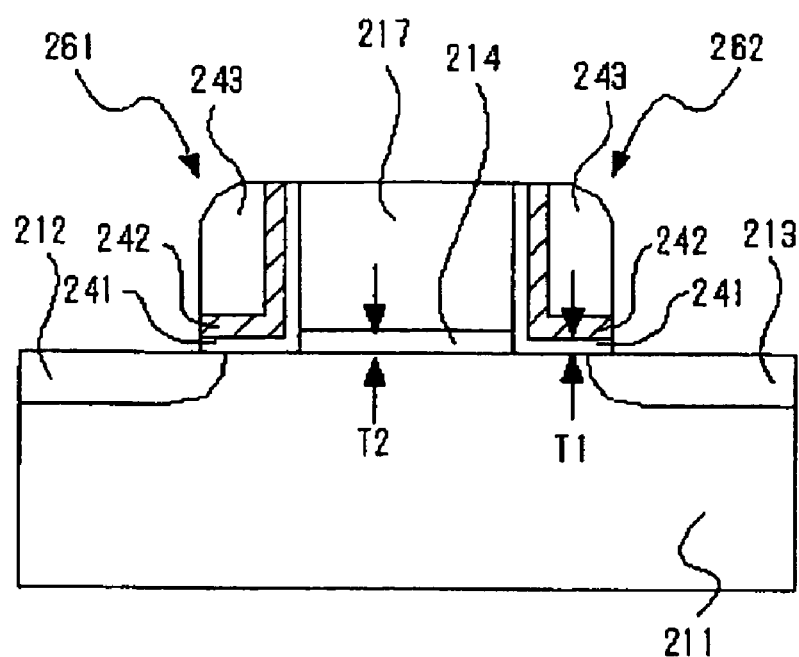
FIG. 17 is a cross-sectional diagram schematically showing a main part of a memory element in the semiconductor storage device of Embodiment 7 of the present invention.

As shown in FIG. 17, a memory element in a semiconductor storage deice of the present embodiment has substantially the same arrangement as that of the memory element in Embodiment 2, except for the arrangement in which a thickness (T1) of an insulating film isolating a charge holding film (silicon nitride film 242) from a channel region or well region is smaller than a thickness (T2) of a gate insulating film.

With the demand for the property of withstanding voltage during writing operation of memory, the gate insulating film 214 has a lower limit of the thickness T2. However, the thickness T1 of the insulating film can be smaller than the thickness T2, regardless of the demand for the property of withstanding voltage.

In this memory element, as described above, a high degree of flexibility in the thickness T1 results from the following grounds.

That is, in this memory element, the insulating film isolating a charge holding film from the channel region or the well region is not sandwiched between the gate electrode and the channel region or well region. Therefore, the insulating film isolating the charge holding film from the channel region or well region is not directly effected not by a high electric field between the gate electrode and the channel region or the well region, but is effected by a relatively weak electric filed extending from the gate electrode in the lateral direction. Therefore, regardless of the demand for the property of withstanding voltage with respect to the gate insulating film, the thickness T1 can be smaller than the thickness T2.

Reduction of the thickness T1 facilitates injection of charges into the memory functioning members, thus allowing for decrease in voltage during writing and erasing operations or speedups of writing and erasing operations. Also, reduction of the thickness T1 increases the amount of charges induced in the channel region or well region when charges are accumulated in the silicon nitride film 242, thus allowing for enhancement in memory effect.

By the way, among electric flux lines in the memory functioning members, there is a short one, as indicated by an arrow 284 in FIG. 13, that does not pass through the silicon nitride film 242. An electric field intensity on such a short electric flux line is relatively high, so that an electric field along this electric flux line plays a large role in writing operation. Reduction of the thickness T1 causes the silicon nitride film 242 to move downward in the drawing, so that the electric flux line indicated by the arrow 283 can pass through the silicon nitride film. This causes a high effective relative permittivity in the memory functioning member along the electric flux line 284, thus allowing for a smaller difference in potential between both ends of the electric flux line. Therefore, a large part of voltage applied to the gate electrode 217 is used to strengthen an electric field in the offset region, thus permitting speedups of writing and erasing operations.

On the contrary, in EEPROM typified by a flash memory, for example, an insulating film isolating a floating gate from a channel region or well region is sandwiched between a gate electrode (control gate) and the channel region or well region, so that the insulating film is directly effected by a high electric field from the gate electrode. Therefore, in the EEPROM, a thickness of the insulating film isolating the floating gate from the channel region or well region is limited, which inhibits the optimization for the functions of the memory element.

As is obvious from the above description, the relation T1<T2 allows for decrease in voltage during writing and erasing operations or speedups of writing and erasing operations, without decrease in voltage resisting performance of memory and further allows for enhancement in memory effect.

Note that, it is more preferable that the thickness T1 of the insulating film is 0.8 nm or more at which uniformity and film quality of the insulating film in manufacturing process can be maintained to a certain level, and which is a limit at which holding property does not degrade to an extreme.

Specifically, for a liquid crystal driver LSI with a large design rule which requires a high withstand voltage, a maximum voltage 15V to 18V is required to drive a liquid crystal panel TFT. Because of this, it is usually impossible to reduce the thickness of a gate oxide film. When a nonvolatile memory of the present embodiment for image control-use is mixed into the liquid crystal driver LSI, in the memory element of the present invention, it is possible to design a suitable thickness of the insulating film insulating a charge holding film (silicon nitride film 242) from the channel region or well region, independently from the thickness of the gate insulating film. For a memory cell with a gate electrode length (word line width) of 250 nm, for example, T1=20 nm and T2=2=10 nm can be set individually, thus realizing a memory cell of an excellent efficiency of writing. (The reason why no short channel effect occurs with the thickness T1 that is larger than that of an ordinary logic transistor is that a source region and a drain region are offset from the gate electrode.)

[Embodiment 8]

Figure 18:
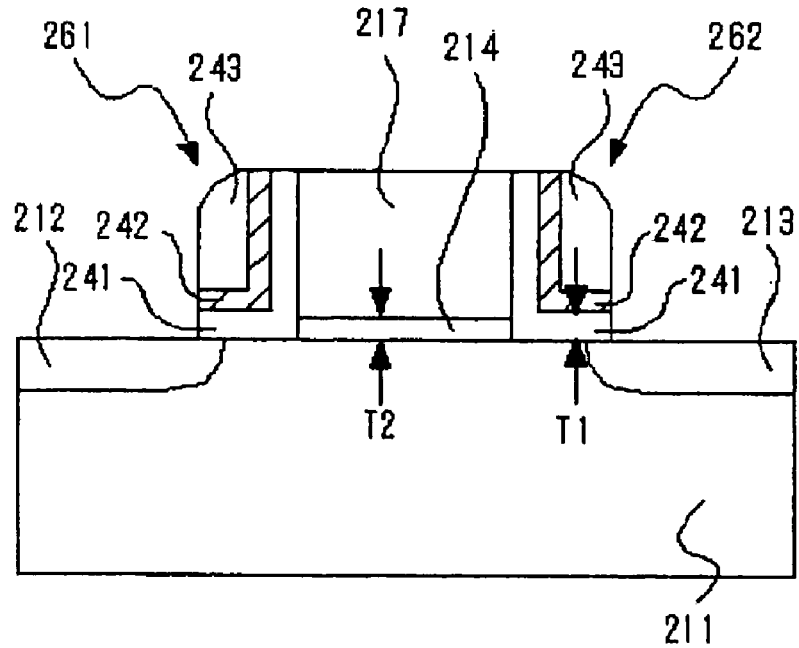
FIG. 18 is a cross-sectional diagram schematically showing a main part of a memory element in the semiconductor storage device of Embodiment 8 of the present invention.

As shown in FIG. 18, a memory element in a semiconductor storage device of the present embodiment has substantially the same arrangement as that of the memory element in Embodiment 2, except for the arrangement in which a thickness (T1) of an insulating film isolating a charge holding film (silicon nitride film 242) from a channel region or well region is larger than a thickness (T2) of a gate insulating film.

For a requirement of prevention of short channel effect in a device, a gate insulating film 214 has an upper limit of its thickness T2. However, the thickness T1 of the insulating film can be larger than the thickness T2, regardless of the requirement for the prevention of short channel effect. That is, for the development of scaling down (the development of reduction in thickness of the gate insulating film), a thickness of an insulating film isolating the charge holding film (silicon nitride film 242) from the channel region or well region can be designed suitably, independently from a thickness of the gate insulating film. This brings about the effect that the memory functioning members do not get in the way of scaling down.

In the memory element of the present embodiment, the reason for a high degree of flexibility in the thickness T1 is, as described above, that the insulating film isolating the charge holding film from the channel region or well region is not sandwiched between the gate electrode and the channel region or well region. Therefore, the thickness T1 can be larger than the thickness T2, regardless of the requirement for the prevention of short channel effect with respect to the gate insulating film. Increase in thickness T1 enables the prevention of charges accumulated in the memory functioning members from scattering and improvement of holding property of memory.

Consequently, the relation T1>T2 enables improvement in holding property without degradation of short channel effect of memory.

Note that, the thickness T1 of the insulating film is preferably 20 nm or less, considering a decrease in rewriting speed.

More specifically, in a conventional nonvolatile memory typified by flash memory, a selection gate electrode constitutes a writing/erasing gate electrode, and a gate insulating film (including a floating gate) corresponding to the write-erasing gate electrode also serves as charge accumulating film. Therefore, the demand for a finer memory element (a thinner film is essential for the prevention of short channel effect) and the demand for high reliability (For prevention of leakage of holding charges, the thickness of an insulating film isolating the floating gate from the channel region or the well region cannot be reduced to about 7 nm or less) are mutually contradictory, and hence, it is difficult to realize a finer memory element. Actually, according to ITRS (International Technology Roadmap for Semiconductors), a physical gate length of about 0.2 micrometer or thinner is not yet in sight. However, in the memory element of the present embodiment, as described above, T1 and T2 can be designed individually, thus realizing a fine film structure.

For example, for a memory cell with a gate electrode length (word line width) of 45 nm, it is possible to realize a memory element which causes no short channel effect by individually setting the memory cell to T2=4 nm and T1=7 nm. The reason why no short channel effect occurs even when T2 is set thicker than a thickness of an ordinary logic transistor is because the source region and the drain region are offset with respect to the gate electrode. Further, in the memory element of the present embodiment, the source region and the drain are offset with respect to the gate electrode, thus further facilitating a finer memory element, as compared to an ordinary logic transistor.

That is, since an electrode for assisting writing and erasing does not exist in an upper part of the memory functioning member, a high electric field acting between the electrode for assisting writing and erasing and the channel region or well region does not directly act on the insulating film isolating the charge holding film from the channel region or the well region, but only a relatively low electric field which spreads in the horizontal direction from the gate electrode acts. Therefore, it is possible to realize a memory element holding a gate length as thin as or thinner than a gate length of a logic transistor in the same fabrication generation.

[Embodiment 9]

A present embodiment relates to a change in electric properties, the change being caused when a memory element is rewritten in a semiconductor storage device.

Figure 19:
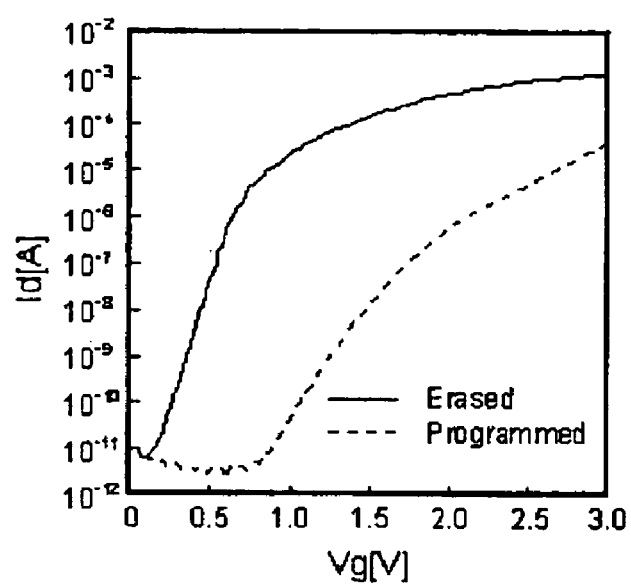
FIG. 19 is a graph showing an electric property of a memory element in a semiconductor storage device of Embodiment 9 of the present invention.

In an N-channel type memory element, a change in an amount of charge in a memory functioning member results in drain current (Id)-gate voltage (Vg) characteristics (measured values), as shown in FIG. 19.

Figure 31:
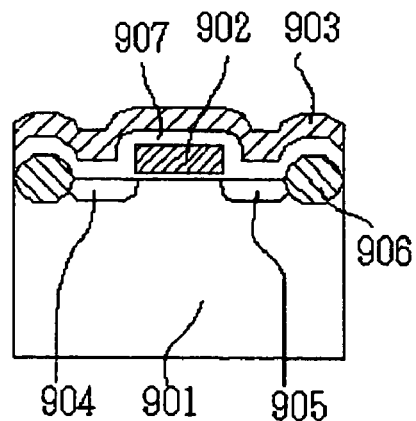
FIG. 31 is a cross-sectional diagram schematically showing a main part of a conventional flash memory.
Figure 32:
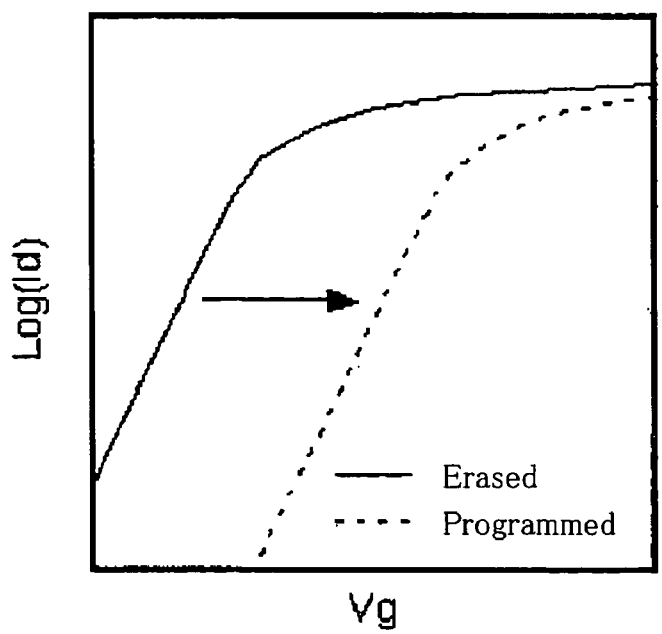
FIG. 32 is a graph showing an electronic property of a conventional flash memory.

As shown in FIG. 19, a writing operation starting from erased state (solid line) not only increases a threshold value, but also significantly decreases the gradient of the graph in a sub-threshold region. Therefore, even in a region in which the gate voltage (Vg) is relatively high, a drain current ratio between an erasing state and a writing state is large. For example, where Vg=2.5V, the current ratio is in two digits or more. This characteristic is significantly different from that of the flash memory (see FIG. 31).

The appearance of this characteristic is a unique phenomenon caused because an offset between a gate electrode and a diffusion region makes it difficult for a gate electric field to enter an offset region. When the memory element is in the writing state, it is very difficult to generate an inversion layer in the offset region under the memory functioning member, even if a positive voltage is applied on the gate electrode. This is the reason why the gradient of the Id–Vg curve is small in the sub-threshold region when the memory element is in the writing state.

On the other hand, when the memory element is in the erasing state, electrons are induced in high density in the offset region. Further, when a voltage of 0V is applied on the gate electrode (that is, when the memory element is in an off state), no induction of electrons is caused in a channel under the gate electrode (therefore, an off current is small). This is the reason why the Id–Vg curve has a large gradient in the sub-threshold region and an increasing rate (conductance) of current is large in the regions at or above the threshold value, when the memory element is in the erasing state.

As described above, the memory element constituting the semiconductor storage device of the present embodiment is capable of attaining an especially large drain current ratio between in writing and in erasing.

[Embodiment 10]

Figure 20:
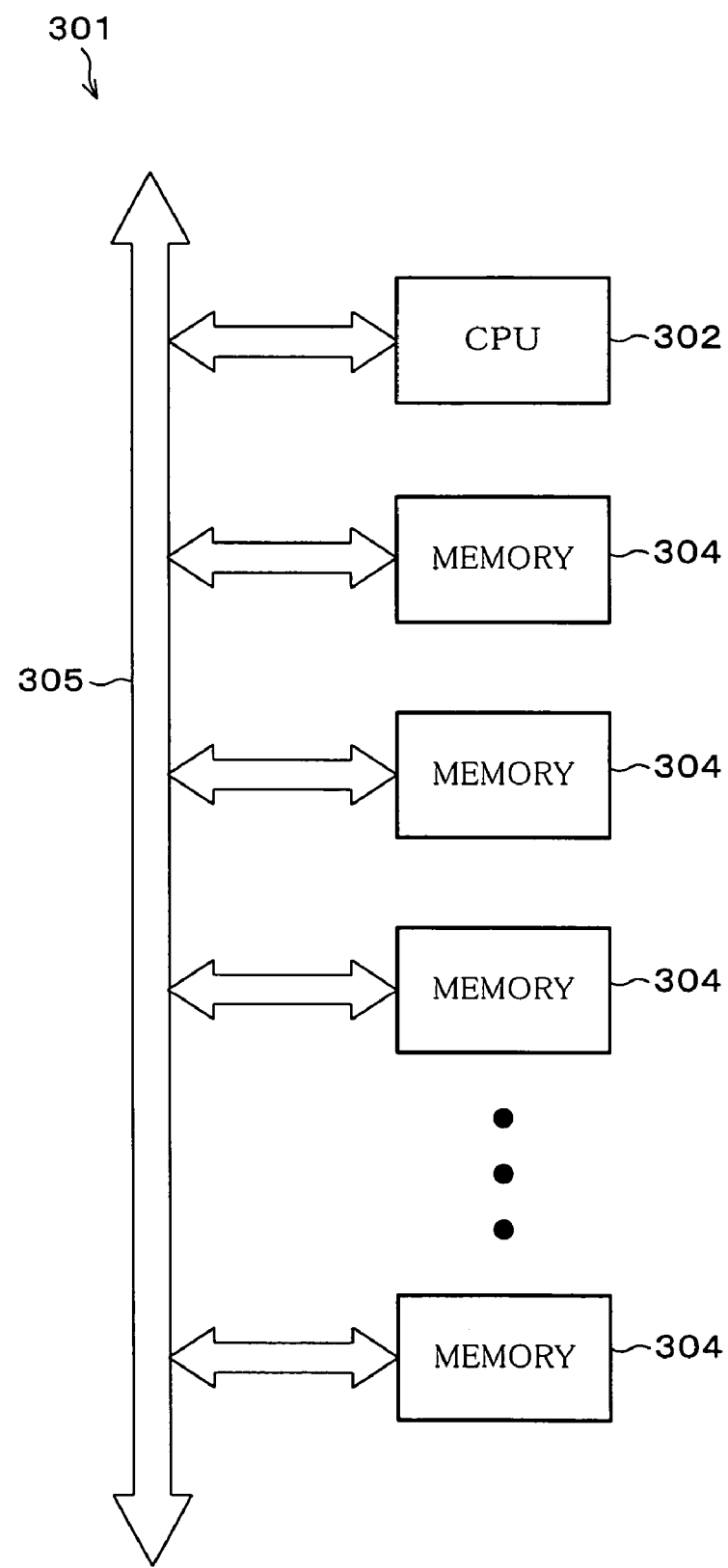
FIG. 20 is a block diagram showing a computer system of the present invention (Embodiment 10) including a semiconductor storage device of Embodiments 1–8 as a memory.

FIG. 20 shows a computer system 301 of the present embodiment.

The computer system 301 includes a CPU (Central Processing Unit) 302, a main memory 303, and a plurality of (a set of) memories 304.

The CPU 302 communicates with the main memory 303 and the memories 304 via a main bus 305. The CPU 302 performs reading of contents in the memory 304 by generating a reading memory cycle via the main bus 305. Further, the CPU 302 performs writing into the memory 304 by transmitting a write command and a write data block to the memory 304 via the main bus 305.

The memory 304, which is a nonvolatile memory element, is realized by a semiconductor storage device according to any one of Embodiments 1–8. Further, the memory 304 provides random access, nonvolatile, large scale data storage for the computer system 301.

Figure 21:
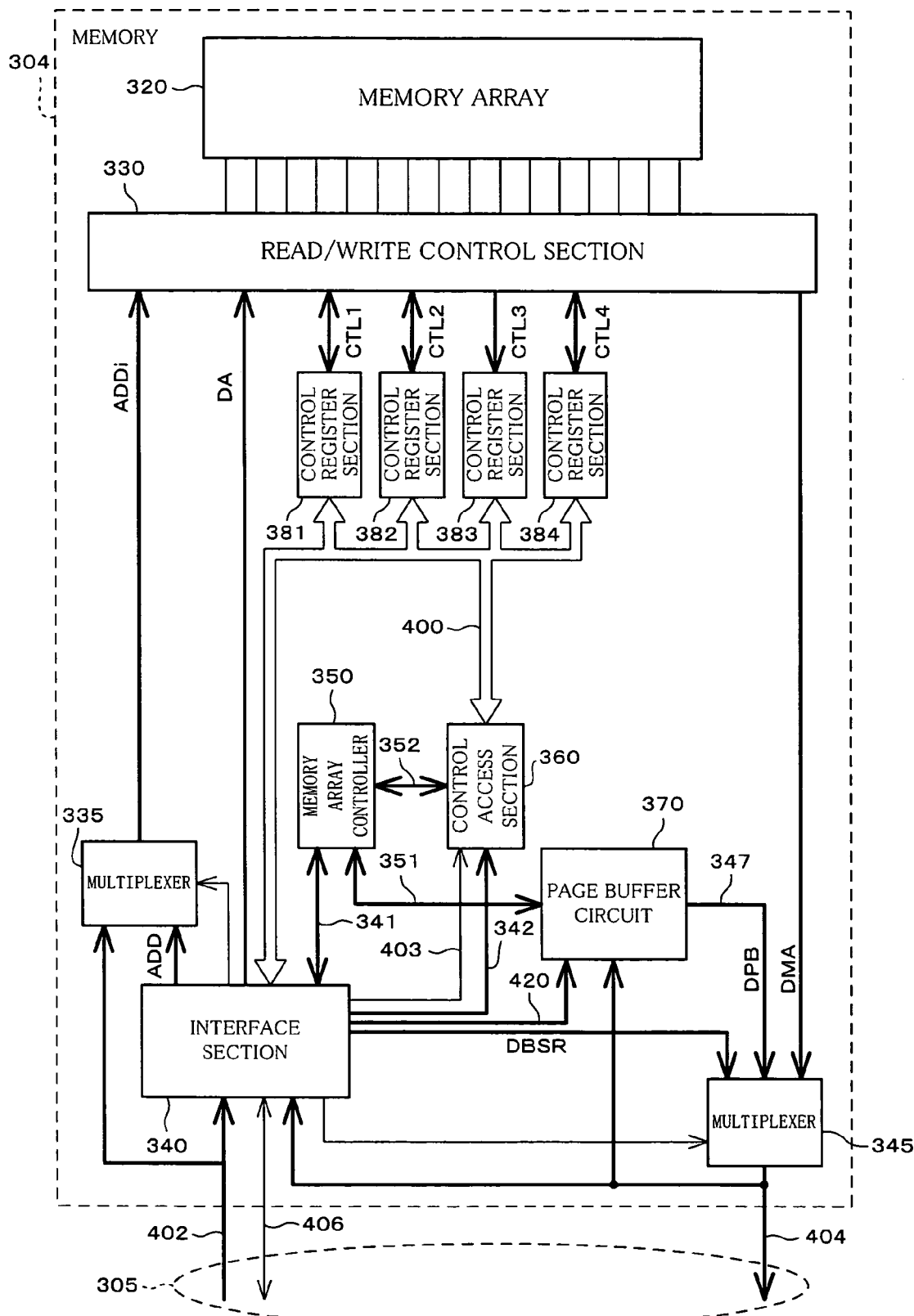
FIG. 21 is a block diagram showing the construction of memories in the computer system shown in FIG. 20.

As described in detail below, in the present embodiment, the CPU 302 eliminates dead time that occurs in performing sequential writes to random access memory and increases the data throughput of the memory 304. In the present embodiment, as shown in FIG. 21, performing sequential writes takes advantage of a page buffer circuit 370 which is provided in each of the memories 304. For example, the CPU 302 is able to write, or load, data associated with one write command into the page buffer circuit 370 while write data associated with a previous write command is being written from the page buffer circuit 370 into a memory array 320 of the memory 304.

First, prior to the description of sequential write operations, the memory 304 will be described in detail.

FIG. 21 shows an internal construction of the memory 304.

As shown in FIG. 21, the memory 304 has the memory array 320, an interface section 340, a memory array controller 350, a page buffer circuit 370, a set of control register sections 381–384, and a read/write control section 330.

An external user, such as the CPU 302, communicates with the memory 304 via a user bus 305. The user bus 305 includes a user address bus 402, a user data bus 404, and a user control bus 406. These buses 402, 404, and 406 are appropriately coupled to terminals, or pins, of the memory 304.

The page buffer circuit 370 is a SRAM (Static Random Access Memory), which provides a plurality of purposes within the memory 304. This page buffer circuit 370 can be accessed by the CPU 302 and the memory array controller 350. As described later, the construction of the page buffer circuit 370 allows the CPU 302 to write to the page buffer circuit 370 while the memory array controller 350 is also using the page buffer 370 to program the memory array 320.

The memory array 320 is an array of nonvolatile memory elements which store data. This nonvolatile memory element is a memory element according to any one of Embodiments 1–8. The memory array 320 of the present embodiment is constructed as 32 blocks. Each block provides 64 k bytes of data storage. Further, in the present embodiment, each block is of 16 bits wide, but may be accessed by the CPU 302 either by 8 bits or by 16 bits.

The read/write control section 330 has a read and write path circuit for accessing the memory array 320. This read/write control section 330 has row and column address decoder for decoding address signals and generating appropriate block select row and column signals for the memory array 320. Further, the read/write control section 330 has a small array of reference memory elements, and a circuit for comparing the reference memory elements to devices from the memory array 320 to determined whether memory bits or devices store a logic 1 or logic 0.

The control register sections 381–384 include specified control registers and an associated circuit for controlling the read/write control section 330. The specified control registers are programmed and accessed via a central control bus 400. The control access section 360 enables operations of the interface section 340 and the memory array controller 350 so as to access the control register sections 381–384 via the central control bus 400.

The interface section 340 can access the memory array 320 by receiving and processing commands obtained via the user bus 305. The interface section 340 obtains commands via the user data bus 404, verifies the commands, and queues the commands to the memory array controller 350 via a queue bus 341. The memory array controller 350 executes the given command.

The interface section 340 controls the selection of an input address ADDi connected to the read/write control section 330 via a multiplexer 335. The selected input address ADDi is either the address sensed by TTL buffers (not shown) on the user address bus 402, or a latched address ADDi from the interface section 340. The input address ADDi is overridden by programming control registers of the control register sections 381–384.

The multiplexer 345 selects one set of data from the inputted sets of data under the control of the interface section 340 and outputs the selected data to the user data bus 404. The selected output data is either array data DA from the read/write control section 330, page buffer data PBD from a page buffer circuit 370, or block status register data DBSR from a set of block status registers 416 (see FIG. 24) included in the interface section 340.

The memory array controller 350 is a specified processor for executing write operations on the memory array 320. This memory array controller 350 uses the commands received via the queue bus 341 to locate an appropriate instruction in a control store.

The CPU 302 reads data from the memory array 320 by transferring address signals via the user address bus 402 while signaling a read command via the user control bus 406. The interface section 340 detects read cycles and causes the multiplexer 335 to transfer the address signals on the user address bus 402 through to an x/y decoder of the read/write control section 330. Further, the interface section 340 causes a multiplexer 345 to transfer the addressed read data from the read/write control section 330 via the user data bus 404.

The CPU 302 writes data to the memory array 320 by transmitting a write command via the user bus 305 to transfer data blocks to be programmed in the page buffer circuit 370. The interface section 340 verifies the write command, and queues the write command to the memory array controller 350. The memory array controller 350 executes the write command by reading the data to be programmed from the page buffer circuit 370 via the control bus 351, and by programming appropriate address locations in the memory array 320.

The memory array controller 350 includes algorithms for controlling a high voltage circuit of the read/write control section 330 to program the memory array 320 by applying charge to the memory functioning member of the memory element and to erase the memory array 320 by removing charge from the memory functioning member. The memory array controller 350 controls the high voltage circuit and addresses the memory array 320 by accessing the control registers 381–384 via the central control bus 400.

The read/write control section 330 has a source switch circuit for providing appropriate voltage levels to the memory array 320 for erase operation. The read/write control section 330 has a program load circuit for distributing program level voltages to bit lines of the memory array 320 during programming operations.

The interface section 340 has a global status register which indicates the status of the page buffer circuit 370. The status bits of the global status register are maintained by memory array controller 350. The CPU 302 reads the contents of the global status registers via the user bus 305.

Figure 22:
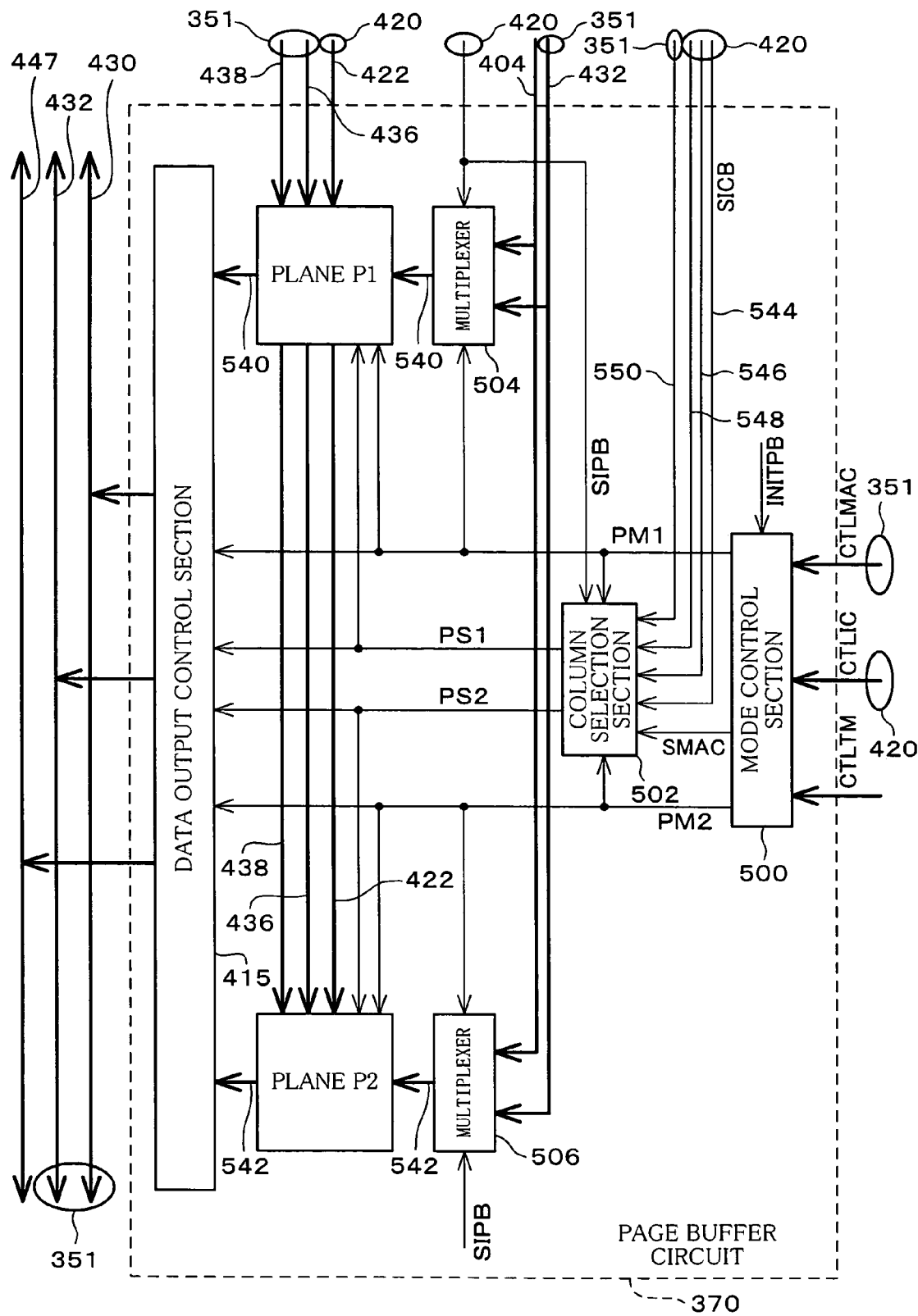
FIG. 22 is a block diagram showing the construction of a page buffer circuit in the memory shown in FIG. 20.

FIG. 22 indicates an internal construction of the page buffer circuit 370.

As shown in FIG. 22, the page buffer circuit 370 includes a mode control section 500, a column selection section 502, multiplexers 504 and 506, and a data output control section 415.

The mode control section 500 determines the mode of the page buffer circuit 370. The mode control section 500 generates a plane mode signal PM1 and a plane mode signal PM2. The plane mode signal PM1 and the plane mode signal PM2 each includes three bits. The plane mode signal PM1 determines the mode of Plane P1, and the plane mode signal PM2 determines the mode of Plane P2. The mode control section 500 generates the plane mode signal PM1 and the plane mode signal PM2 based on MAC control signals CTLMAC from the memory array controller 350, IC control signals CTLIC from the command processing section 410, and test mode control signals CTLTM.

The MAC control signals CTLMAC include bit 7 from MAC program counter, bit 8 of the MAC address bus 436, and the bits of the current MAC instruction. The IC control signal CTLIC includes bit 8 of the IC address bus 422, an IC plane status signal, and an IC plane selection signal. Further, the IC control signal CTLIC includes an MAC plane signal, an MAC plane selection signal, a single byte/word write signal, and a write sequential signal.

The test mode control signal CTLTM includes an MAC control store enable signal, a test mode extension signal, and a two-bit MAC override signal. The MAC control store enable signal determines whether the page buffer circuit 370 functions as control store for the memory array controller 350. The test mode expansion signal determines whether the page buffer circuit 370 functions in expansion modes EM6 and EM7.

Further, the page buffer circuit 370 contains two 256 by 8 bit SRAM (Static Random Access Memory) planes (Plane P1 and Plane P2).

Figure 23:
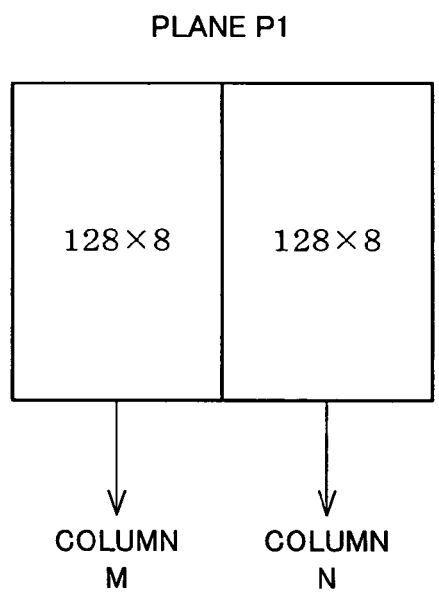
FIG. 23($a$) and FIG. 23($b$) are diagrams showing two planes provided in the page buffer circuit.
Figure 23:
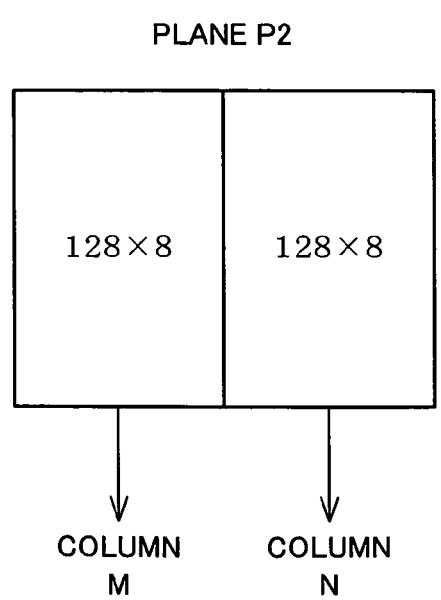

FIG. 23 represents the construction of the Plane P1 and the Plane P2 of the page buffer circuit 370. The Planes P1 and P2 each include two 128×8 bit columns, which are called column M and column N.

A command bus 420 transmits an interface address bus 422, IC control signals (not shown) and an IC byte signal SICB. The control bus 351 includes a memory array controller (MAC) data bus 432, an MAC address bus 436, an MAC program counter bus 438, and an MAC instruction bus 430, and transmits MAC control signals CTLMAC.

The rows of the Plane P1 and Plane P2 are addressed via the IC address bus 422, the MAC address bus 436, and the MAC program counter bus 438. The command processing section 410 in the interface control section 340 shown in FIG. 24 addresses the Plane P1 and the Plane P2 via the IC address bus 422. The memory array controller 350 addresses the Plane P1 and the Plane P2 during data access via the MAC address bus 436. Further, the memory array controller 350 addresses the Plane P1 and the Plane P2 during instruction fetches via the MAC program counter bus 438.

Here, the following will describe operation modes of the page buffer circuit 370.

The page buffer circuit 370 operates in four modes: mode M2 through mode M5. These modes are applied to both the Plane P1 and the Plane P2, and are selected via mode signals Mode [2:0] for each of the Plane P1 and the Plane P2. Hereinafter, in the case where the Plane P1 and the Plane P2 are not identified, "plane" is simply used.

In mode M2, the interface section 340 allows the external user (CPU 302, etc) to read a plane of the page buffer circuit 370.

In mode M3, the interface section 340 allows the external user to write to a plane of the page buffer circuit 370. A user mode write to a plane of the page buffer circuit 370 is write byte/word processing or a write sequential processing. The write byte/word processing to the page buffer circuit 370 begins when the interface section 340 receives a write page buffer command from the CPU 302 via the user bus 305. The write page buffer command specifies a write address in the page buffer circuit 370, as well as the data to be written at that address (write data). The command processing section 410 transfers the write address to a plane of the page buffer circuit 370 via the IC address bus 422. The plane obtains the write data via the user data bus 404.

The write sequential processing to a plane of the page buffer circuit 370 begins when the interface section 340 obtains a write page buffer sequential command from the CPU 302 via the user bus 305. The write page buffer sequential command specifies a byte count, which indicates the number of bytes to be written. In the interface section 340, a write counter circuit (not shown) is loaded within the byte count when the write page buffer sequential command is obtained.

Thereafter, the write counter circuit counts down so that the selected plane obtains the write data via the user data bus 404. While the write data are being received, the command processing section 410 addresses the selected plane via the ID address bus 422 in accordance with the write counter circuit.

In mode M4, the memory array controller 350 allows the external user to read data from a plane. For example, the memory array controller 350 reads programming data from the plane during a program in a page buffer operation. The memory array controller 350 addresses the selected plane via the MAC address bus 436.

The memory array controller 350 obtains the corresponding programming data from the selected plane via the MAC data bus 432.

In mode M5, the memory array controller 350 allows the external user to write data to a plane. At this moment, the memory array controller 350 addresses the selected plane via the MAC address bus 436 and transfers the corresponding write data to the selected plane via the MAC data bus 432.

In these modes, the interface section 340 coordinates access to the Planes P1 and P2 in accordance with commands received via the user bus 305. This ensures that the interface section 340 and the memory array controller 350 do not access the same plane.

Next, the page buffer circuit 370 will be further described in detail below to clarify a method of pipelining sequential writes to the memory 304. This method, when executed by the CPU 302, can maximize the data throughput of the memory 304. This decreases dead time of the CPU 302, and the CPU 302 does not need to wait for the memory 304 to complete one programming command before another programming command for the memory 304 begins.

Similarly, the memory 304 does not need to wait for the CPU 302 to load the program data before another program operation begins. Therefore, CPU cycles and memory element cycles that were previously inactive or dead become active.

Figure 25:
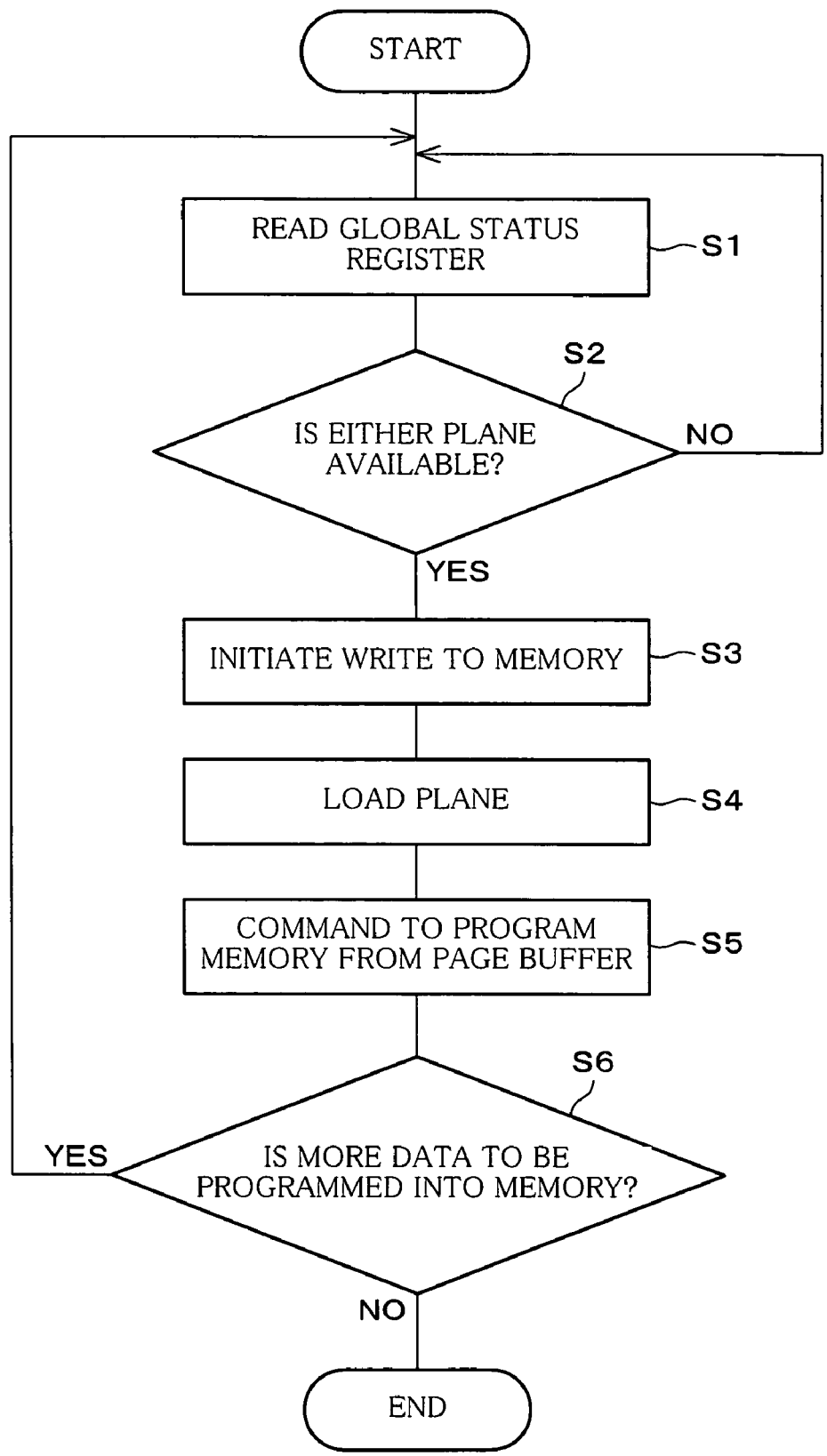
FIG. 25 is a flowchart showing steps of pipelining writes to a memory shown in FIG. 20.

FIG. 25 shows steps of pipelining writes to the memory 304.

In these steps, both the Plane P1 and the Plane P2 of the page buffer circuit 370 are used to interleave write commands. To carry out sequential writes to a plane of the page buffer circuit 370, the plane must be available for user access. The CPU 302 determines whether a plane is available by reading a bit stored in a global status register, which is a part of a block status register 416. Reading the global status register is realized by two processes for the CPU 302.

First, the CPU 302 issues a read status register command accompanied by the address of the global status register (S1). In response to the read status register command, the global status register outputs a page buffer availability bit PBAVAIL indicating the availability for user access of a plane, via the user data bus 404 to the CPU 302. The CPU 302 evaluates the page buffer availability bit PBAVAIL to determine if a plane of the page buffer circuit 370 is available for access (S2). A plane is always available when it is not allocated to the memory array controller 350.

The CPU 302, when recognizing that a plane is available for user access by the page buffer availability bit PBAVAIL, initiates pipelining writes to the memory 304 (S3).

A write cycle by the CPU 302 includes the following two steps. First, the CPU 302 loads a plane of the page buffer circuit 370, and then, the memory array controller 350 programs the memory array 320 with the data loaded into the plane.

Figure 26:
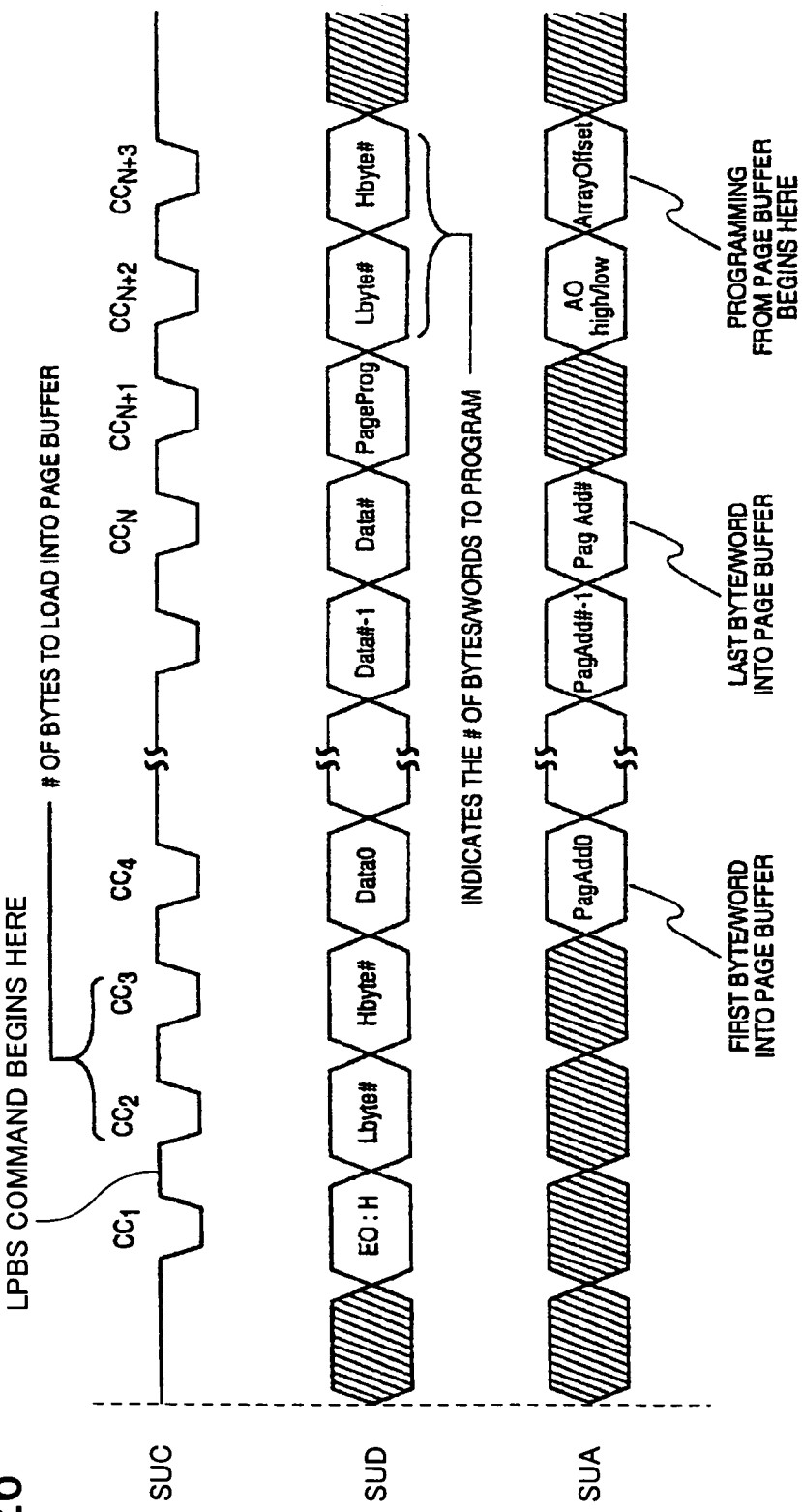
FIG. 26 is a diagram showing control signals, address signals, and data signals used in the steps shown in FIG. 25.

FIG. 26 shows the combination of control signals, address signals and data signals that the CPU 302 couples to the user bus 305 in step S3 to issue a load page buffer sequential command to the memory 304.

During the first CPU clock cycle of loading, the CPU 302 causes the write enable signal WEB to be active low while providing signals to the user data bus 404 representing in hexadecimal a load page buffer sequential command code. In the present embodiment, the command code for the load page buffer sequential command is E0 (hexadecimal). The particular command code representing a load page buffer sequential command is not important to the present invention, only that the CPU 302 gives the correct command code for a sequential load of the page buffer circuit 370.

In the subsequent CPU clock cycle, the CPU 302 informs the memory 304 of the number of bytes or words of data loaded into the allocated plane of the page buffer circuit 370. Whether the number indicates bytes or words depends upon whether the memory 304 is operating in a by 8 or by 16 mode.

The number of CPU clock cycles necessary to indicates the number of bytes to be sequentially loaded in the page buffer circuit 370 depends on and the number of data pins of the memory 304 and the memory size of the planes. In the example illustrated in FIG. 26, two CPU clock cycles, CC2 and CC3, are required to indicate the number of bytes to be loaded. The low byte including the least significant bits of the number is loaded during the CPU clock cycle CC2, and the high byte is loaded during the CPU clock cycle CC3. During these two CPU clock cycles, the signals of the user address bus 402 are not available.

In the CPU clock cycle following the number of bytes/words to be loaded, the CPU 302 begins loading of the allocated plane of the page buffer byte/word at a time (S4). At the beginning of the load, a clock cycle CC4 is used. Each byte/word of data loaded by the CPU 302 is accompanied by an address, which indicates the location within a plane where the particular byte is temporarily stored. The address signals are provided to the memory 304 via the user address bus 402.

In the case where the CPU 302 finishes loading of the plane P1 of the page buffer circuit 370 during the CPU clock cycle CCN, the CPU 302 can command the memory 304 in the following clock cycle CCN+1 to begin programming the memory array 320 with the data just loaded into the plane P1. However, the CPU 302 does not so in Step S5, but the page buffer circuit 370 commands the memory 304 to program.

The CPU 302 signals the program with a page buffer command by writing command code 0C (hexadecimal) to the user data bus 404. Again, the particular command code representing a program from the page buffer command is not important, to this method, only that the correct command code, whatever it is, be given by the CPU 302 to the memory 304. The CPU 302 completes the command in the following clock cycles CCN+2 and CCN+3 by indicating the number of bytes in the memory array 320 to be programmed from the page buffer circuit 370.

In 8 bit mode shown in FIG. 26, the 0 bit, i.e. A0 of the user address bus 402 determines whether the data signals received during CCN+2 are recognized as the low byte or high byte of the 16 bit word indicating the number of bytes to be programmed.

Figure 27:
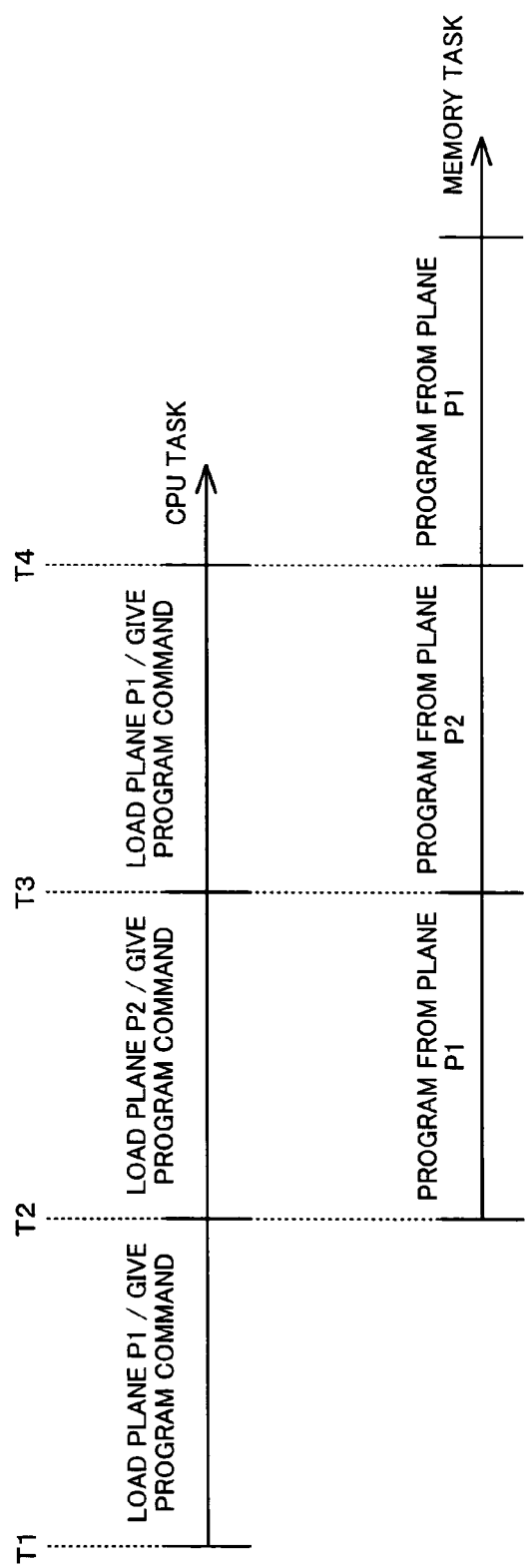
FIG. 27 is a diagram showing interleave of program operations using the above page buffer circuit.

During the last CPU clock cycle CCN+3 of the program from the page buffer command, when the CPU 302 informs the memory 304 of a starting address in the memory array 320, the CPU 302 transmits the address/signals representing that address to the memory 304 via the user address bus 402. Thus, in the clock cycle CCN+3, the CPU 302 completes the tasks necessary to the first program task. During that same clock cycle, the memory array controller 350 begins programming of the memory array 320. As indicated by time T2 in FIG. 27, the CPU 302 completes the share of a first write signal. In FIG. 27, CPU tasks are shown on the upper side, and memory tasks are shown on the lower side. The CPU 302 increases the data throughput of the memory 304 by loading the Plane P2 between time T2 and time T3 while the memory array controller 350 is programming the Plane P1 during a time where the two tasks overlap. This decreases the deadtime of the CPU 302 because it need not wait for the memory array controller 350 to finish programming prior to the initiation of another write operation.

Upon completion of the loading of a plane of the page buffer circuit 370 at time T2, the CPU 302 determines whether or not more data is to be programmed into the memory 304 (S6). If more data is to be programmed, the CPU 302 returns to Step S1 and determines again whether a plane is available, while the memory array controller 350 programs the memory array 320 from the Plane P2. If more data is not to be programmed, the CPU 302 ends its writing of the memory 304. The CPU 302 performs the processes in Steps S1–S5 repeatedly between the time T2 and T3 shown in FIG. 27.

According to the steps shown in FIG. 25, data throughput of the memory 304 with respect to sequential writes to the page buffer circuit 370 increases. The data throughput of the memory 304 can be increased even when only one byte at a time is loaded into a plane of the page buffer circuit 370. The increase in throughput is realized by writing to one plane of the page buffer circuit 370 while the memory array controller 350 is programming from the other plane.

Since the page buffer circuit 370 is used to increase the data throughput of the memory 304, the constitution and operation of the memory 304 will be discussed once again. Within the memory 304, the page buffer circuit 370 is controlled partially by the interface section 340.

Figure 24:
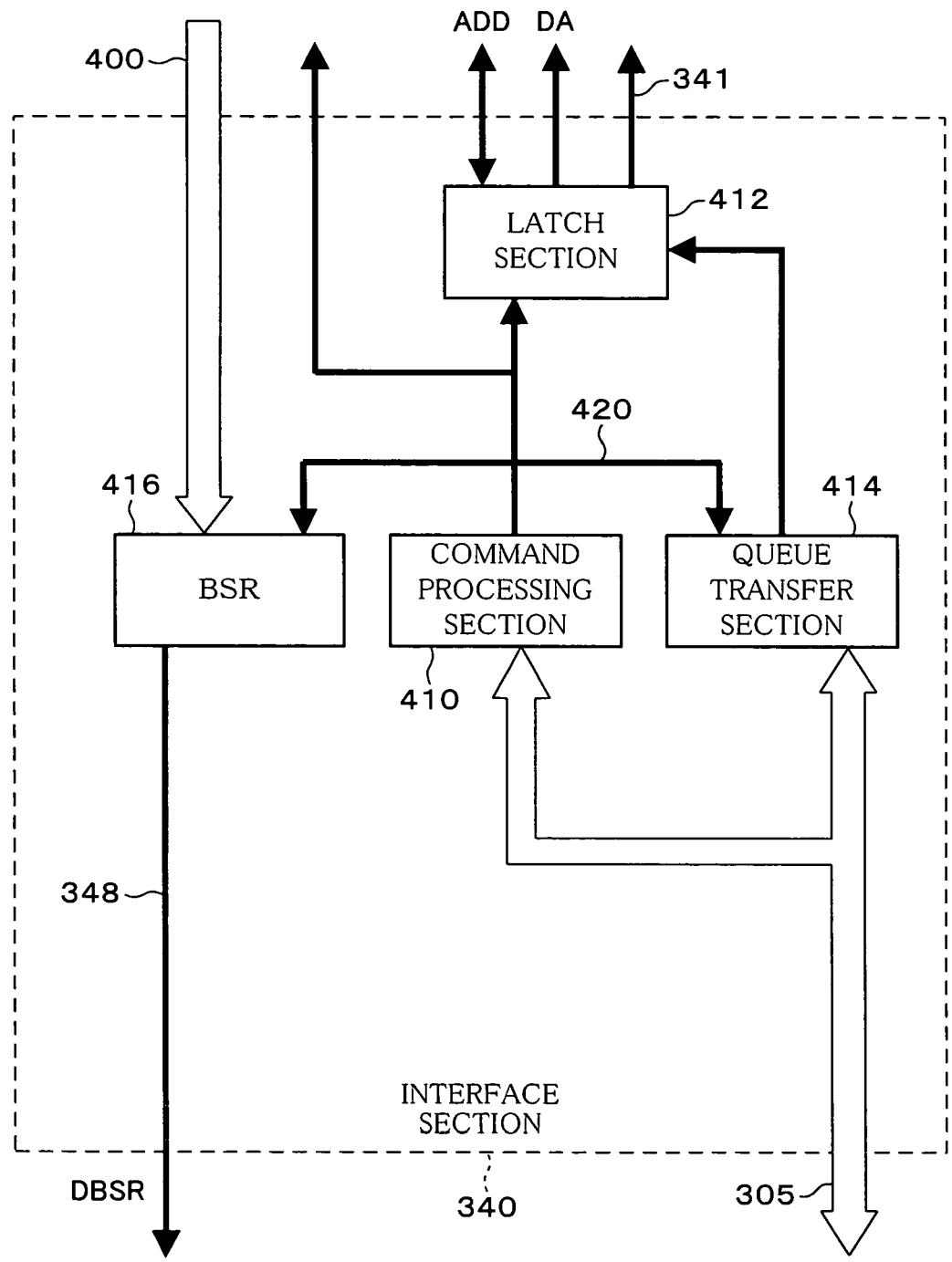
FIG. 24 is a block diagram showing the constitution of an interface section in a memory shown in FIG. 20.

The interface section 340 shown in FIG. 24 includes a command processing section 410, a latch section 412, a queue transfer section 414, and block status registers (BSR) 416.

The command processing section 410 obtains command signals from the CPU 302 via the user bus 305. Valid commands from the CPU 302 includes commands programming a selected group of cells in the memory cell array 320. The maximum size of the selected group of cells depends on the width of bit in the write path, which is 16 bits wide in the present embodiment. The number of devices programmed at one time depends on the addressing scheme predetermined, by 8 or by 16. Further, valid commands include block erase by which an entire block of the memory 304 is erased at one time. The CPU 302 can also command the programming and erasure of data stored in the page buffer circuit 370.

The command processing section 410 decodes the commands, and generates control signals representing parameters associated to the commands to the memory array controller 350 through the queue transfer section 414. Further, the command processing section 410 transfers control signals via the command bus 420 to control the mode of the planes of the page buffer circuit 370.

The command processing section 410 generates command signals for reading the status registers of the BSR 416 including the global status register. Further, the command processing section selects the status registers of the BSR 416 by sending address and control signals to the BSR 416 via the command bus 420.

The queue transfer section 414 sends address signals ADD latched in the latch section 412 to the multiplexer 335. Further, the queue transfer section 414 transfers array data DA latched in the latched section 412 to the read/write control section 330. Still further, the queue transfer section 414 transfers the verified commands and associated parameters to the memory array controller 350 via the queue bus 341.

The command processing section 410 transfers the status register address via the command bus 420 to select the block status registers addressed in the BSR 416. The contents of the addressed status register are outputted from the BSR 416 to the multiplexer 345 via the BSR data bus 348. The command processing section 410 causes the multiplexer 345 to output the status register read data on the BSR data bus 348 via the user data bus 404.

In the page buffer circuit 370, address bits shown are transferred via the MAC address bus 436, the IC address bus 422, and the MAC program counter bus 438 in accordance with the mode of the page buffer circuit 370. The address bits shown are transferred via the MAC address bus 436, the IC address bus 422, and the MAC program counter bus 438 in accordance with the current mode. Address bit A8 serves as a plane selection signal for selecting either the Plane P1 or the Plane P2. Address bits A7 through A1 select a row of the Plane P1 and the Plane P2. Address bit A0 selects either the high byte or the low byte of a row.

The mode control section 500 determines the mode of the page buffer circuit 370 and generates a plane mode signal PM1 and a plane mode signal PM2 each including three bits. The plane mode signal PM1 selects the mode for the Plane P1, and the plane mode signal PM2 selects the mode for the Plane P2.

The mode control section 500 generates the plane mode signal PM1 and the plane mode signal PM2 based on MAC control signals CTLMAC from the memory array controller 350, IC control signals CTLIC from the command processing section 410, and test mode control signals CTLTM.

The MAC control signals CTLMAC include bit 7 from MAC program counter, bit 1 of the MAC address bus 436, and the bits of the current MAC instruction. The IC control signals CTLIC include bit 8 of the IC address bus 422, an IC plane status signal, and an IC plane selection signal. The IC control signals CTLIC include an MAC plane status signal, an MAC plane selection signal, a single byte/word write signal, and a write sequential signal. Plane assignment is determined by the MAC plane selection signal, the MAC plane status signal, and the MAC override signal.

If bits 0 and 1 of the MAC override signal are both a logical 0, the MAC plane selection signal determines whether the memory array controller 350 is allocated the Plane P1 or the Plane P2. The MAC plane status signal indicates whether the plane indicated by the MAC plane selection signal is available.

The MAC override signals override normal plane assignment when they are not 00, and allocate either the Plane P1 or the Plane P2 to the memory array controller 350. Otherwise, plane assignment depends on the MAC plane status signal and the MAC plane selection signal.

The plane assignment for the interface section 340 is determined by the IC plane status signal, and the IC plane selection signal. The IC plane selection signal determines whether the interface section 340 is allocated the Plane P1 or the Plane P2. The IC plane status signal indicates whether the plane selected by the IC plane selection signal is available.

The command processing section 410 generates the IC plane status signal, the IC plane selection signal, the MAC plane status signal, and the MAC plane selection signal to allocate the Plane P1 and the Plane P2 to either the memory array controller 350 or the interface section 340. The command processing section 410 generates the IC and MAC plane status and plane selection signals to ensure that the Plane P1 is not simultaneously allocated to both the memory array controller 350 and the interface section 340. Similarly, the command processing section 410 generates the IC and MAC plane status and plane selection signals to ensure that the Plane P2 is not simultaneously allocated to both the memory array controller 350 and the interface section 340.

The mode control section 500 generates an MAC byte signal SMAC (352). The MAC byte signal 352 indicates whether the memory array controller 350 is performing a byte or a word access of the page buffer section 370. The mode control section 500 determines the byte or word access by decoding the current MAC instruction.

The column selection section 502 obtains the plane mode signal PM1, the plane mode signal PM2, and the MAC byte signal SMAC (352) from the mode control section 500, and obtains an IC byte signal 344. The IC byte signal SICB indicates whether the external user performs byte or word access to the page buffer circuit 370. The byte or word access from the user is determined by a control input pin connected to the user control bus 406.

The column selection section 502 obtains bit 0 of the IC address bus 422 via a signal line 546, and bit 9 of the IC address bus 422 via a signal line 548. The column selection section 502 receives bit 0 of the MAC address bus 436 via a signal line 550. The column selection section 502 generates plane selection signals PS1 and PS2 each including three bits. The plane selection signal PS1 is a signal for selecting a column of the Plane P1, and the plane selection signal PS2 is a signal for selecting a column of the Plane P2.

The plane selection signal PS2 is determined by the plane mode signal PM2, the MAC override signal, an initialization signal, bit 0 of the MAC address, bit 0 of the IC address, the MAC byte signal SMAC 352, and the IC byte signal SICB.

The plane selection signal PS1 is determined by the plane mode signal PM1, the MAC override signal, bit 0 of the MAC address, bit 0 of the IC address, the MAC byte signal SMAC 352, and the IC byte signal SICB.

The Plane P1 receives input data via the multiplexer 506. The multiplexer 506 receives data via the MAC data bus 432 from the memory array controller 350 and via the user data bus 404 from the external user. The multiplexer 506 is controlled by the plane mode signal PM1.

In modes M2 and M3, the plane mode signal PM1 causes the multiplexer 504 to transfer input data from the user data bus 404 to the Plane P1. In modes M4 and M5, the plane mode signal PM1 causes the multiplexer 504 to transfer input data from the MAC data bus 432 to the input of the Plane P1.

The Plane P2 obtains input data under the control of the multiplexer 506. The multiplexer 506 receives data via the MAC data bus 432 from the memory array controller 350 and via the user data bus 404 from the user. The multiplexer 506 is controlled by the plane mode signal PM2.

In modes M2 and M3, the plane mode signal PM2 causes the multiplexer 506 to transfer input data from the user data bus 404 to the input of the Plane P2. In modes M4 and M5, the plane mode signal PM2 causes the multiplexer 506 to transfer input data from the MAC data bus 432 to the input of the Plane P2.

The Plane P1 outputs data via a plane data bus 540 having 19 bits wide. The plane data bus 540 includes a high byte from column M, a low byte from column N, and 3 remnant bits from column L. The Plane P2 outputs data via a plane data bus 542 having 19 bits wide. The plane data bus 542 includes the high byte from column M, the low byte from column N, and the 3 remnant bits come from column L. The Plane P1 outputs data via the plane data bus 540 having 19 bits wide. The plane data bus 540 includes a high byte from column M and a low byte from column N. The Plane P2 outputs data via the plane data bus 542 having 19 bits wide. The plane data bus 542 includes the high byte from column M and the low byte from column N.

Figure 28:
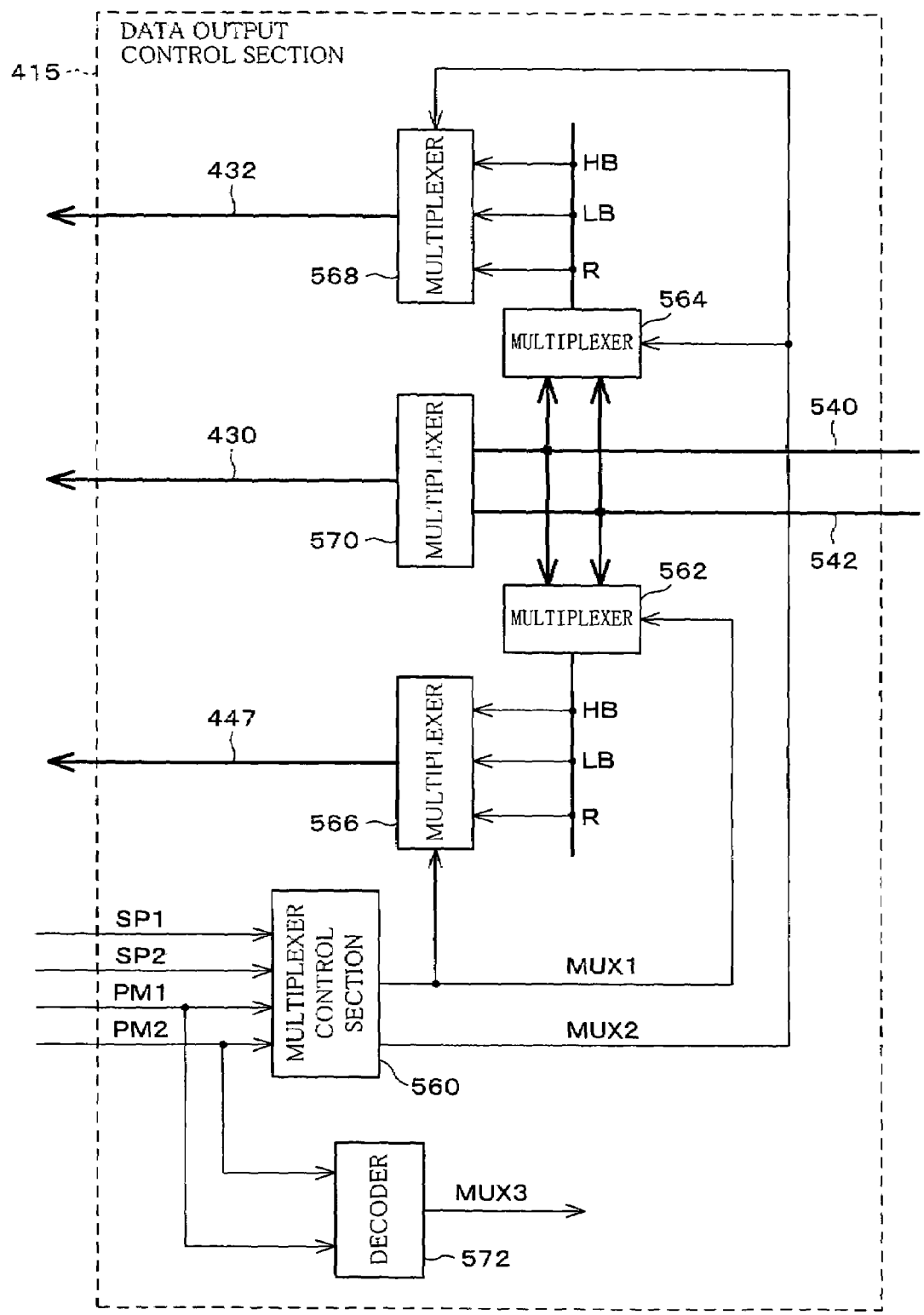
FIG. 28 is a block diagram showing the construction of a data output control section in a memory shown in FIG. 20.

FIG. 28 shows a data output control section 415.

As shown in FIG. 28, the data output control section 415 transfers output data from the Plane P1 and the Plane P2 via an MAC instruction bus 430, an MAC data bus 432 and an IC data bus 447 in accordance with the state of the plane mode signal PM 1, the plane mode signal PM2, the plane selection signal PS1, and the plane selection signal PS2.

The multiplexer control section 560 receives the plane selection signal PS1, the plane selection signal PS2, the plane mode signal PM1, and the plane mode signal PM2. The multiplexer control section 560 generates a pair of multiplexer control signals MUX1 and MUX2.

The decoder 572 generates a multiplexer control signal 382 based on the plane mode signals PM1 and PM2.

The multiplexer 562 selectively connects a first plane data bus 540 and a second plane data bus 543 to the inputs of the multiplexer 566. The first plane data bus 540 holds the high byte HB, the low byte LB and the remnant bits R from the Plane P1. The second plane data bus 542 holds the high byte HB, the low byte LB and the remnant bits R from the Plane P2. The multiplexer 562 selectively connects the first plane data bus 540 and the second plane data bus 542 to the multiplexer 566 under the control of the multiplexer control signal MUX1.

The multiplexer 562 selectively connects the first plane data bus 540 and the second plane data bus 543 to the input of the multiplexer 566. The first plane data bus 540 holds the high byte HB, the low byte LB and the remnant bits R from the Plane P1. The second plane data bus 542 holds the high byte HB, the low byte LB and the remnant bits R from the Plane P2. The multiplexer 562 selectively connects the first plane data bus 540 and the second plane data bus 542 to the multiplexer 566 under the control of the multiplexer control signal MUX1.

The multiplexer 564 selectively connects the first plane data bus 540 and the second plane data bus 543 to the input of the multiplexer 568. The multiplexer 564 selectively connects the first plane data bus 540 and the second plane data bus 542 to the multiplexer 568 under the control of the multiplexer control signal MUX2.

The multiplexer 568 selectively connects the received high byte HB, the received low byte LB and the received remnant bits R to the data bus 432 under control of the multiplexer control signal MUX1. For example, the MAC data bus 432 is 16 bits wide.

The multiplexer 570 receives output data from the Plane P1 via the first plane data bus 540 and receives output data from the Plane P2 via the second plane data bus 542. This multiplexer 570 selectively connects first plane output data and second plane output data to the MAC instruction bus 430 under the control of the multiplexer control signal MUX3. For example, the MAC instruction bus 430 is 19 bits wide and includes the high and low bytes and the three remnant bits respectively from columns L, M, and N.

As described above, in the present embodiment, write operations are pipelined using the page buffer circuit 370 in the memory 304, thereby increasing the data throughput of the memory 304. This brings about the effect of increase in writing speed by using sidewall memory and a further speedup of writing process.

The foregoing writing control method includes the steps for realizing speed-up of writing by performing one-side interleave operation using two planes in loading and writing, with respect to a semiconductor storage device having: (a) a memory array having a plurality of memory elements each having: a gate electrode provided on a semiconductor layer with an intervening gate insulating film; a channel region provided beneath the gate electrode; a diffusion region provided on both sides of the channel region, having an opposite polarity to the channel region; and a memory functioning member, provided on both sides of the gate electrode, having a function of holding electric charges; (b) a page buffer circuit including a first plane and a second plane; and (c) a memory control circuit controlling writing with respect to the memory array and being capable of accessing the page buffer circuit, Thus, by using the page buffer circuit in the memory array, it is possible to improve data processing of the memory array.

Adopting the foregoing memory element, instead of the conventional flash memory, produces the following effects.

The memory element constituting the memory array is realized in the foregoing arrangement. A formation process of the memory element is highly compatible with a formation process of an ordinary transistor. Thus, it is possible to reduce the number of masks and the number of process steps, as compared to a device on which the conventional flash memory as non-volatile memory element and a periphery circuit including the ordinary transistor are mounted together. This improves the yields of chips and realizes cost reduction.

Further, the memory functioning member in the memory element further includes a charge holding film extending substantially parallel to the side surface of the gate electrode, thereby increases rewriting speed. Thus, the foregoing memory element, which provides a faster program speed than the conventional memory element, enables completion of program operation in a shorter time, as compared to the case where the flash memory described in the conventional art is programmed.

Still further, the memory element has a P-type high concentration region close to the channel side of the N-type diffusion region. Thus, the foregoing memory element, which provides a faster program speed than the conventional memory element, enables completion of program operation in a shorter time, as compared to the case where the flash memory described in the conventional art is programmed.

Yet further, the memory element has an insulating film separating the channel region or the semiconductor layer from a film having a surface substantially parallel to a surface of the gate insulating film to hold electric charge; and the insulating film is thinner than the gate insulating film and not thicker than 0.8 nm. This arrangement facilitates the injection of electric charges into the memory functioning member and increases rewriting speed. Thus, the foregoing memory element, which provides a faster program speed than the conventional memory element, enables completion of program operation in a shorter time, as compared to the case where the flash memory described in the conventional art is programmed.

[Embodiment 11]

Figure 29:
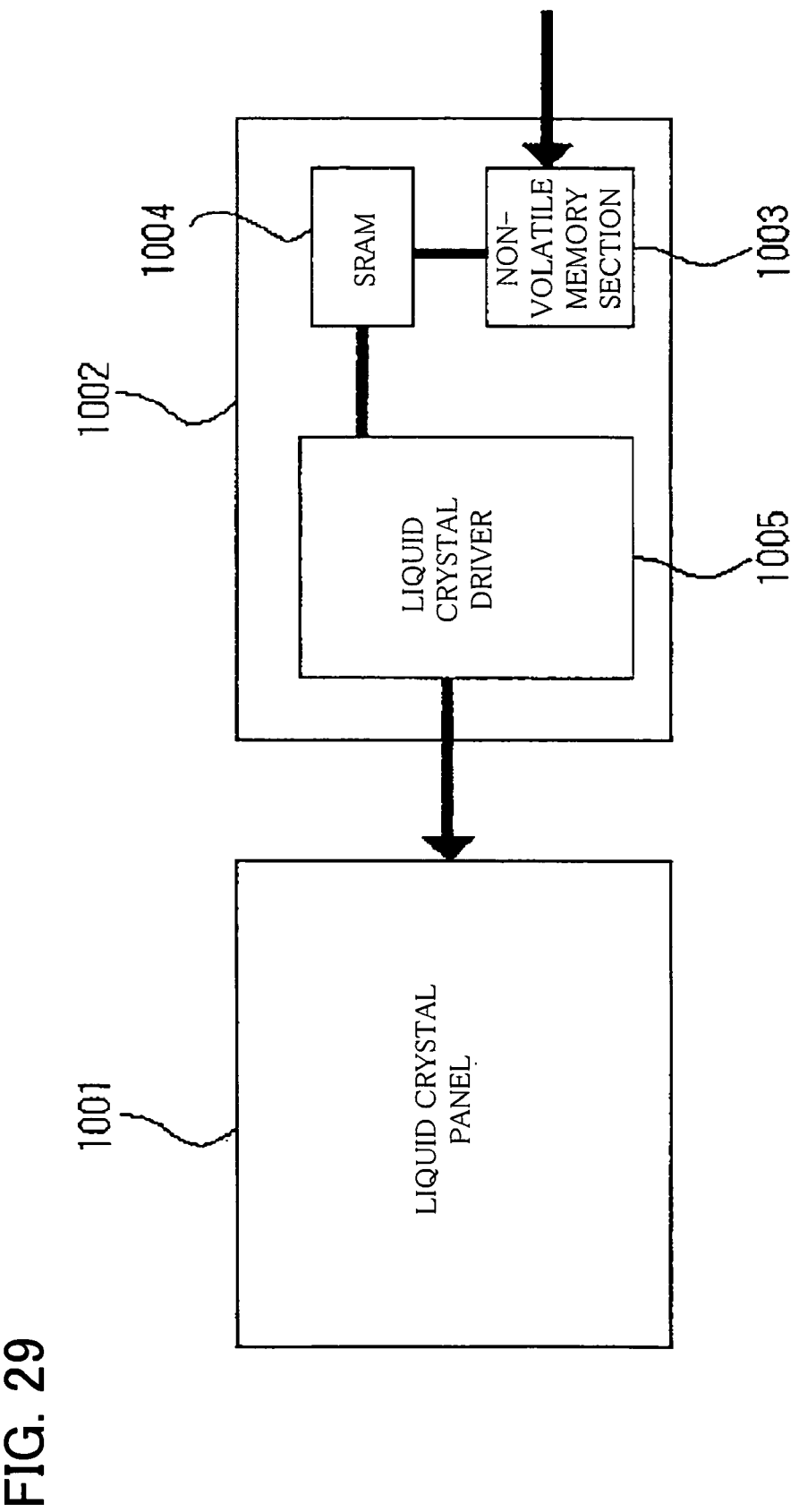
FIG. 29 is a schematic diagram of a liquid crystal display device (Embodiment 11) including a computer system of Embodiment 10 of the present invention.

One of application examples of the semiconductor storage device is a non-volatile memory as shown in FIG. 29. The non-volatile memory, which is rewritable, is used for adjusting an image in a liquid crystal panel.

A liquid crystal panel 1001 is driven by a liquid crystal driver 1002. The liquid crystal driver is provided with a non-volatile memory section 1003, an SRAM section 1004, and a liquid crystal driver circuit 1005. The non-volatile memory section 1003 is provided with a memory element of any of Embodiments 1 through 8. It is more preferable that the memory element provided in the non-volatile memory section 1003 includes the computer system 301 described in Embodiment 10. The non-volatile memory section 1003 can be rewritten by external operation.

Data stored in the non-volatile memory section 1003 is transferred to the SRAM section when the liquid crystal panel 1001 is powered on. The liquid crystal driver circuit 1005 can read out the stored data from the SRAM section when necessary. With the arrangement in which the SRAM section is provided, it is possible to attain a very fast read-out of the stored data.

The liquid crystal driver 1002 may be, as shown in FIG. 29, provided externally of the liquid crystal panel 1001, but may be formed on the liquid panel 1001.

In liquid crystal panels, a gray level to be displayed is changed by applying multi-leveled voltages on each pixel. However, different liquid crystal panels have different relationships between the applied voltage and the gray level to be displayed. Therefore, with an arrangement in which date for compensating unevenness among individual liquid crystal panels is stored in the liquid crystal panels after being produced, it is possible to attain even image quality among the liquid crystal panels by performing compensation based on the data. Therefore, it is preferable that the liquid crystal panel is provided with a rewritable non-volatile memory for storing the data for the compensation. It is preferable to use the memory element of the present embodiment as the non-volatile memory. Especially, it is preferable to use the semiconductor storage device described in Embodiment 10. In the semiconductor storage device described in Embodiment 10, the memory elements of the present embodiment are integrated.

By using the memory element of the present embodiment as the non-volatile memory for adjusting the image in the liquid crystal panel, it is possible to attain low manufacturing cost because it is easy to mount the memory element of the present embodiment, on one chip, together with a circuit such as a liquid crystal driver and the like. Moreover, the semiconductor storage device described in Embodiment 10 is especially suitable for usage in which a relatively small memory capacity is required while high reliability and stability are necessary. In general, the non-volatile memory for adjusting the image in the liquid crystal panel is, for example, several kilo bites and thus has a relatively small memory capacity. Therefore, it is especially preferable to use the semiconductor storage device described in Embodiment 10 as the non-volatile memory for adjusting the image in the liquid crystal panel.

[Embodiment 12]

Figure 30:
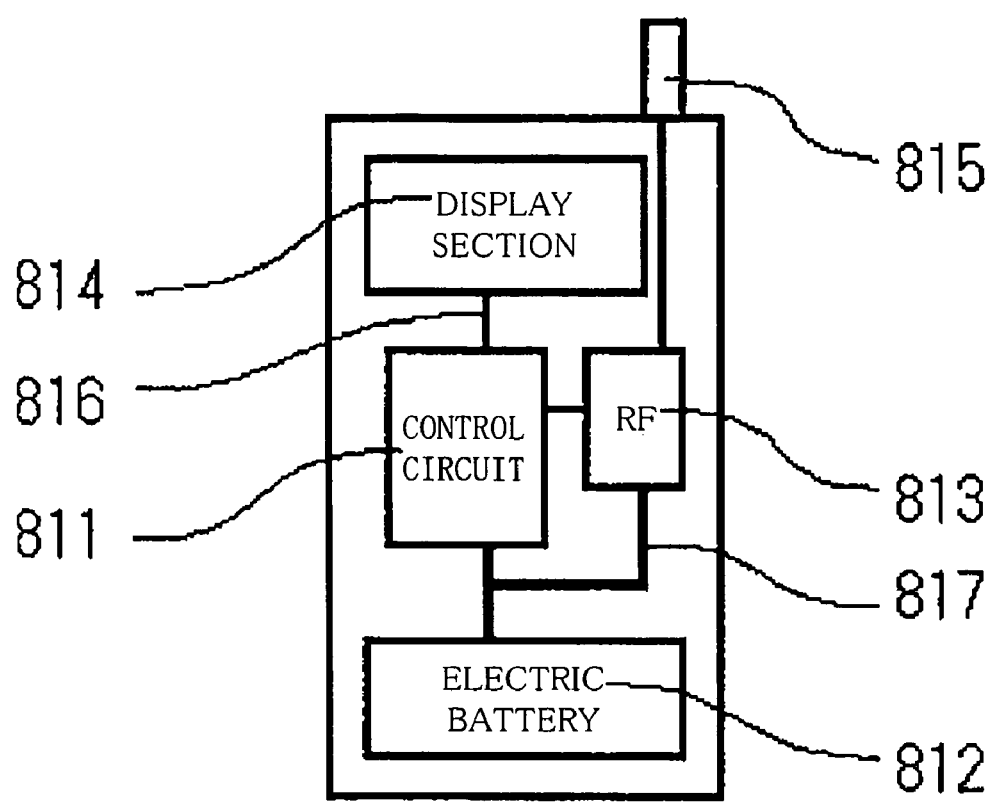
FIG. 30 is a schematic diagram of a portable electronic apparatus (Embodiment 12) including a computer program of Embodiment 10 of the present invention.

FIG. 30 shows a portable telephone, which is a portable electronic apparatus in which the semiconductor storage device described in Embodiment 10 is included.

The portable telephone is mainly provided with a control circuit 811, an electric battery 812, an RF (Radio Frequency) circuit 813, a display section 814, an antenna 815, a signal line 816, a power line 817, and the like. The control circuit 811 is provided with the semiconductor storage device described in Embodiment 10. It is preferable that the control circuit 811 is an integrated circuit which has the arrangement as described in Embodiment 10, and which functions as both a memory circuit element and a logic circuit element. With this arrangement, it becomes easier to produce the integrated circuit and reduce a production cost of the portable electronic apparatus, especially.

As described above, it is possible to attain faster operation speed and lower production cost of the portable electronic apparatus by using the semiconductor storage device in the portable electronic apparatus, the semiconductor storage device being advantageous in allowing easy process of mounting together a logic circuit section and a memory section and in attaining a high-speed read-out. Therefore, it is possible to attain a portable electronic apparatus having a low cost, a high reliability and high performance.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

What is claimed is:

1. A writing control method of sequentially writing data into a semiconductor storage device,
   the semiconductor storage device including a memory system having: (a) a memory array having a plurality of memory elements each having: a gate electrode provided on a semiconductor layer with an intervening gate insulating film; a channel region provided beneath the gate electrode; a diffusion region provided on both sides of the channel region, having an opposite polarity to the channel region; and a memory functioning member, provided on both sides of the gate electrode, having a function of holding electric charges; (b) a page buffer circuit including a first plane and a second plane; and (c) a memory control circuit controlling writing with respect to the memory array and being capable of accessing the page buffer circuit,
   the writing control method comprising:
   a first step of writing first data into the first plane;
   a second step of controlling the memory control circuit to write the first data having been written into the first plane into the memory array;
   a third step of writing second data into the second plane while the first data having been written into the first plane is written into the memory array; and
   a fourth step of controlling the memory control circuit to write the second data having been written into the second plane into the memory array.

2. The writing control method as set forth in claim 1, further comprising:
   a step of initially determining whether the first and second planes are available for user access.

3. The writing control method as set forth in claim 2, wherein:
   the determination step reads a status register included in the memory array.

4. The writing control method as set forth in claim 1, wherein:
   the third step is performed in a clock cycle immediately following the second step.

5. The writing control method as set forth in claim 1, wherein:
the first and second planes comprise static random access memory.

6. The writing control method as set forth in claim 1, wherein:
a memory functioning member in each memory element further includes a charge holding film extending substantially parallel to a side surface of the gate electrode.

7. The writing control method as set forth in claim 1, wherein:
the semiconductor layer in each memory element has a greater concentration region close to the diffusion region than close to a surface of the semiconductor layer beneath the gate electrode.

8. The writing control method as set forth in claim 1, wherein:
each memory element has an insulating film separating the channel region or the semiconductor layer from a film having a surface substantially parallel to a surface of the gate insulating film to hold electric charge; and
the insulating film is thinner than the gate insulating film and not thicker than 0.8 nm.

9. A writing control system where data are sequentially written into a semiconductor storage device,
the semiconductor storage device including a memory system having: (a) a memory array having a plurality of memory elements each having: a gate electrode provided on a semiconductor layer with an intervening gate insulating film; a channel region provided beneath the gate electrode; a diffusion region provided on both sides of the channel region, having an opposite polarity to the channel region; and a memory functioning member, provided on both sides of the gate electrode, having a function of holding electric charges; (b) a page buffer including a first plane and a second plane; and (c) a memory control circuit controlling writing with respect to the memory array and being capable of accessing the page buffer,
the writing control system comprising: first plane writing means writing a first byte of data into the first plane;
first writing control means controlling the memory control circuit to write the first byte of data having been written into the first plane into the memory array;
second plane writing means writing a second byte of data into the second plane while the first byte of data having been written into the first plane is written into the memory array; and
second writing control means controlling the memory control circuit to write the second byte of data having been written into the second plane into the memory array.

10. The writing control system as set forth in claim 9, further comprising:
determination means initially determining whether the first and second planes are available for user access.

11. The writing control system as set forth in claim 10, wherein:
the determination means include means for reading a status register included in the memory array.

12. The writing control system as set forth in claim 9, wherein:
the second plane writing means writes the second plane in a clock cycle immediately following the control of the memory control circuit by the first writing control means.

13. The writing control system as set forth in claim 9, wherein:
a memory functioning member in each memory element further includes a charge holding film extending substantially parallel to a side surface of the gate electrode.

14. The writing control system as set forth in claim 9, wherein:
the semiconductor layer in each memory element has a greater concentration region close to the diffusion region than close to a surface of the semiconductor layer beneath the gate electrode.

15. The writing control system as set forth in claim 9, wherein:
each memory element has an insulating film separating the channel region or the semiconductor layer from a film having a surface substantially parallel to a surface of the gate insulating film to hold electric charge; and
the insulating film is thinner than the gate insulating film and not thicker than 0.8 nm.

16. A portable electronic apparatus, comprising the writing control system as set forth in claim 9.

17. A writing control system where data are written into a semiconductor storage device,
the semiconductor storage device including a memory system having: (a) a memory array having a plurality of memory elements each having: a gate electrode provided on a semiconductor layer with an intervening gate insulating film; a channel region provided beneath the gate electrode; a diffusion region provided on both sides of the channel region, having an opposite polarity to the channel region; and a memory functioning member, provided on both sides of the gate electrode, having a function of holding electric charges; (b) a page buffer including a first plane and a second plane; and (c) a memory control circuit controlling writing with respect to the memory array and being capable of accessing the page buffer,
the writing control system comprising:
first plane writing means writing a byte of data into the first plane by providing a set of first data signals to the memory system;
first writing control means controlling the memory control circuit to write the byte of data having been written into the first plane into the memory array by providing command signals to the memory system, the command signal representing writing from the page buffer to the memory array;
second plane writing means, while the memory control circuit performs writing to the memory array, writing a block of data into the second plane by providing data signals representing a block of data to the memory system; and
second writing control means controlling the memory control circuit to write the block of data having been written into the second plane into the memory array by providing command signals to the memory system, the command signal representing writing from the page buffer to the memory array.

18. The writing control system as set forth in claim 17, further comprising:
determination means initially determining whether the first and second planes are available for user access.

19. The writing control system as set forth in claim 18, wherein:
the determination means include means for reading a status register included in the memory array.

20. The writing control system as set forth in claim 17, wherein:
the first writing control means performs control of the memory control circuit in a clock cycle immediately following writing of the first plane by the first plane writing means.

21. The writing control system as set forth in claim 17, wherein:
the second plane writing means writes the second plane in a clock cycle immediately following control of the memory control circuit by the first writing control means.

22. The writing control system as set forth in claim 17, wherein:
the second writing control means performs control of the memory control circuit in a clock cycle immediately following writing of the second plane by the second plane writing means.

23. The writing control system as set forth in claim 17, wherein:
the first and second planes comprise static random access memory.

24. The writing control system as set forth in claim 17, wherein:
a memory functioning member in each memory element further includes a charge holding film extending substantially parallel to a side surface of the gate electrode.

25. The writing control system as set forth in claim 17, wherein:
the semiconductor layer in each memory element has a greater concentration region close to the diffusion region than close to a surface of the semiconductor layer beneath the gate electrode.

26. The writing control system as set forth in claim 17, wherein:
each memory element has an insulating film separating the channel region or the semiconductor layer from a film having a surface substantially parallel to a surface of the gate insulating film to hold electric charge; and
the insulating film is thinner than the gate insulating film and not thicker than 0.8 nm.

27. A portable electronic apparatus, comprising the writing control system as set forth in claim 17.

28. A writing control system where data are sequentially written into a semiconductor storage device,
the semiconductor storage device including a memory system having: (a) a memory array having a plurality of memory elements each having: a gate electrode provided on a semiconductor layer with an intervening gate insulating film; a channel region provided beneath the gate electrode; a diffusion region provided on both sides of the channel region, having an opposite polarity to the channel region; and a memory functioning member, provided on both sides of the gate electrode, having a function of holding electric charges; (b) a page buffer including a first plane and a second plane; and (c) a memory control circuit controlling writing with respect to the memory array and being capable of accessing the page buffer,
the writing control system comprising:
first plane writing means writing a first block of data into the first plane by providing a set of first data signals representing the first block of data to the memory system;
first writing control means controlling the memory control circuit to write the first block of data having been written into the first plane into the memory array by providing command signals to the memory system, the command signal representing writing from the page buffer to the memory array;
second plane writing means, while the memory control circuit performs writing to the memory array, writing a second block of data into the second plane by sequentially providing data signals representing the second block of data to the memory system; and
second writing control means controlling the memory control circuit to write the second block of data having been written into the second plane into the memory array by providing command signals to the memory system, the command signal representing writing from the page buffer to the memory array.

29. The writing control system as set forth in claim 28, further comprising:
determination means initially determining whether the first and second planes are available for user access.

30. The writing control system as set forth in claim 29, wherein:
the determination means include means for reading a status register included in the memory array.

31. The writing control system as set forth in claim 28, wherein:
the first writing control means performs control of the memory control circuit in a clock cycle immediately following writing of the first plane by the first plane writing means.

32. The writing control system as set forth in claim 28, wherein:
the second plane writing means writes the second plane in a clock cycle immediately following control of the memory control circuit by the first writing control means.

33. The writing control system as set forth in claim 28, wherein:
the second writing control means performs control of the memory control circuit in a clock cycle immediately following writing of the second plane by the second plane writing means.

34. The writing control system as set forth in claim 28, wherein:
the first and second planes comprise static random access memory.

35. The writing control system as set forth in claim 28, wherein:
the first plane writing means first commands sequential writing of the page buffer by providing command signals to the memory array, the command signal representing sequential writing of the page buffer.

36. The writing control system as set forth in claim 35, wherein:
the first plane writing means specifies the number of bytes of data written into the page buffer.

37. The writing control system as set forth in claim 28, wherein:
the second plane writing means first commands sequential writing of the page buffer by providing command signals to the memory array, the command signal representing sequential writing of the page buffer.

38. The writing control system as set forth in claim 37, wherein:
the second plane writing means specifies the number of bytes of data written into the page buffer.

39. The writing control system as set forth in claim 28, wherein:

the first and second writing control means specify a start address in the memory array.

40. The writing control system as set forth in claim 28, wherein:
a memory functioning member in each memory element further includes a charge holding film extending substantially parallel to a side surface of the gate electrode.

41. The writing control system as set forth in claim 28, wherein:
the semiconductor layer in each memory element has a greater concentration region close to the diffusion region than close to a surface of the semiconductor layer beneath the gate electrode.

42. The writing control system as set forth in claim 28, wherein:
a each memory element has an insulating film separating the channel region or the semiconductor layer from a film having a surface substantially parallel to a surface of the gate insulating film to hold electric charge; and
the insulating film is thinner than the gate insulating film and not thicker than 0.8 nm.

43. A portable electronic apparatus, comprising the writing control system as set forth in claim 28.

* * * * *